(12) United States Patent

Inoue et al.

(10) Patent No.: US 12,622,084 B2

(45) Date of Patent: May 5, 2026

(54) IMAGE SENSOR AND IMAGE SENSOR MANUFACTURING METHOD

(71) Applicant: OMNIVISION TECHNOLOGIES, INC., Santa Clara, CA (US)

(72) Inventors: Ikuko Inoue, Kanagawa (JP); Cynthia Sun Yee Lee, Santa Clara, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 118 days.

(21) Appl. No.: 18/820,464

(22) Filed: Aug. 30, 2024

(65) Prior Publication Data

US 2025/0311463 A1 Oct. 2, 2025

(30) Foreign Application Priority Data

Apr. 1, 2024 (JP) ................................. 2024-058752

(51) Int. Cl.
*H10F 39/00* (2025.01)

(52) U.S. Cl.
CPC ......... *H10F 39/811* (2025.01); *H10F 39/026* (2025.01); *H10F 39/8037* (2025.01)

(58) Field of Classification Search
CPC .. H10F 39/811; H10F 39/026; H10F 39/8037; H10F 39/802; H10F 39/014; H10F 39/18; H10F 39/803; H04N 25/59; H04N 25/77; H04N 25/771; H04N 25/79
See application file for complete search history.

(56) References Cited

U.S. PATENT DOCUMENTS

| | | | |
|---|---|---|---|
| 9,165,959 B2 | 10/2015 | Chen et al. | |
| 9,184,208 B2 | 11/2015 | Kobayashi et al. | |
| 10,121,807 B2 | 11/2018 | Wakano et al. | |
| 10,186,512 B2 * | 1/2019 | Hanzawa | H04N 25/671 |
| 11,488,996 B2 * | 11/2022 | Lee | H04N 23/672 |
| 2021/0343777 A1 | 11/2021 | Otake et al. | |
| 2022/0239853 A1 | 7/2022 | Kurihara et al. | |
| 2022/0367555 A1 | 11/2022 | Komoto et al. | |
| 2023/0179883 A1 | 6/2023 | Seto | |

FOREIGN PATENT DOCUMENTS

JP 2023-84462 A 6/2023

* cited by examiner

*Primary Examiner* — Seung C Sohn

(74) *Attorney, Agent, or Firm* — Christensen O'Connor Johnson Kindness PLLC

(57) ABSTRACT

A multilayer wiring layer is laminated over a wafer. Wirings formed in the multilayer wiring layer include a capacitance control wiring and an FD-SF wiring. The capacitance control wiring is capacitively coupled with a floating diffusion, and a boost signal which increases a potential of the floating diffusion is transmitted on the capacitance control wiring. The FD-SF wiring connects the floating diffusion and a source follower transistor. The multilayer wiring layer includes an FD connection layer and a first control line layer. The FD-SF wiring is formed in the FD connection layer. The capacitance control wiring is formed in the first control line layer. In the multilayer wiring layer, the first control line layer is the wiring layer closest to the FD connection layer.

20 Claims, 18 Drawing Sheets

IMAGE SENSOR AND IMAGE SENSOR MANUFACTURING METHOD

CROSS REFERENCE TO RELATED APPLICATION

This application claims priority to Japanese Patent Application No. 2024-058752 filed on Apr. 1, 2024, which is incorporated herein by reference in its entirety including the specification, claims, drawings, and abstract.

TECHNICAL FIELD

The present specification discloses an image sensor and its manufacturing method.

BACKGROUND

For example, US 2023/0179883 A discloses a photoelectric conversion apparatus. Charges accumulated in a photoelectric conversion unit (photodiode) are transferred to a floating diffusion unit by a transfer transistor. The photoelectric conversion apparatus comprises a wiring layer. In the wiring layer, a transfer control line, a connection wiring, and a shield wiring are provided. A drive signal for the transfer transistor is transmitted to the transfer control line. The connection wiring connects the floating diffusion unit and a gate of an amplification transistor. Further, the shield wiring is provided between the connection wiring and the transfer control line.

Charges accumulated in the photodiode are transferred to the floating diffusion. As a value showing detection efficiency of the charges, a conversion gain is used. The conversion gain indicates a signal voltage [μV] or a digital value (DN) obtained per one electron of the signal. If a large signal voltage or a large digital value is obtained with a small number of electrons, the conversion gain is high. As such, as a capacitance of the floating diffusion becomes smaller, the conversion gain becomes higher.

The floating diffusion may be likened to a well which stores charges. In the floating diffusion, in order to increase the conversion gain, the capacitance must be reduced to increase a potential. When the potential is small, phenomena such as "lag" in which charges remain in the photodiode, or "injection" in which charges are injected from the floating diffusion to the photodiode are more likely to occur.

In addition, a "feedthrough" may occur, in which, when a pulse signal is applied to a terminal in an image sensor, a potential of another terminal is varied through a parasitic capacitance. When the potential of the floating diffusion is reduced (i.e., when the well is shallowed) due to the feedthrough, the lag and the injection are even more likely to occur.

In view of the above, the present specification discloses an image sensor capable of suppressing lag and injection while suppressing feedthrough that reduces the potential of the floating diffusion, and a manufacturing method thereof.

SUMMARY

An image sensor disclosed herein includes at least one wafer, and a multilayer wiring layer. On the wafer, a photodiode, a floating diffusion FD, and a source follower transistor SF are formed. The photodiode photoelectrically converts incident light. The floating diffusion temporarily holds charges accumulated in the photodiode. The source follower transistor has a gate connected to the floating diffusion. The multilayer wiring layer is laminated over the wafer. Wirings formed in the multilayer wiring layer include a capacitance control wiring and an FD-SF wiring. The capacitance control wiring is capacitively coupled with the floating diffusion, and a boost signal which increases a potential of the floating diffusion is transmitted thereon. The FD-SF wiring connects the floating diffusion and the source follower transistor. The multilayer wiring layer includes an FD connection layer and a first control line layer. The FD-SF wiring is formed in the FD connection layer. The capacitance control wiring is formed in the first control line layer. In the multilayer wiring layer, the first control line layer is a wiring layer which is closest to the FD connection layer.

According to the above configuration, the FD-SF wiring and the capacitance control wiring are placed close to each other. Accordingly, a large-capacitance wiring capacitance is caused between the FD-SF wiring and the capacitance control wiring. In the process of transferring the charges stored in the photodiode to the floating diffusion, when the boost signal is transmitted on the capacitance control wiring, the potential of the floating diffusion is sufficiently increased (i.e., the well is deepened). In addition, with the configuration in which the first control line layer is the closest to the FD connection layer, the wiring layer which would reduce the potential of the floating diffusion can be separated from the FD connection layer. In other words, because a wiring pitch is widened, the wiring capacitance can consequently be reduced.

In the above configuration, a transfer transistor may be formed. The transfer transistor transfers charges photoelectrically converted by the photodiode to the floating diffusion. In this configuration, a transfer wiring is formed in the first control line layer. On the transfer wiring, a transfer signal for the transfer transistor is transmitted.

As shown, at a time t4 in FIG. 2 to be described later, when the transfer signal is transmitted (TX: Lo→Hi), the potential of the floating diffusion is increased by the feedthrough. With the configuration in which the transfer wiring is formed in the first control line layer, the potential increase of the floating diffusion by the feedthrough can be sufficiently achieved.

In the above configuration, a reset transistor may be formed in the image sensor. The reset transistor resets the potential of the floating diffusion to a reference potential. The wirings formed in the multilayer wiring layer further include a reset wiring. On the reset wiring, a reset signal for the reset transistor is transmitted. The multilayer wiring layer further includes a second control line layer in which the reset wiring is formed.

As shown, at a time t2 in FIG. 2 to be described later, when the reset signal is switched (RST: Hi→Lo), the potential of the floating diffusion is reduced by the feedthrough (i.e., the well is shallowed). With the configuration in which the reset wiring is separated from the first control layer, influences of the feedthrough by the reset signal can be suppressed.

In the above configuration, a row selection transistor may be formed in the image sensor. The row selection transistor is connected to a source of the source follower transistor. In that case, in the second control line layer, a row selection wiring is formed on which a row selection signal for the row selection transistor is transmitted.

As shown, at a time t11 in FIG. 6 to be described later, when a row selection signal is transmitted (RS: Lo→Hi), the potential of the floating diffusion is reduced by the feedthrough (i.e., the well is shallowed). With the configuration in which the row selection wiring is separated from the first control layer, influences of the feedthrough by the row selection signal can be suppressed.

In the above configuration, the FD-SF wiring may intersect the transfer wiring and the capacitance control wiring in a circuit plan view.

According to the above configuration, because a distance between the FD-SF wiring and the transfer wiring, and the distance between the FD-SF wiring and the capacitance control wiring are both small, a wiring capacitance of a relatively large capacitance is formed.

In the above configuration, the FD connection layer may be formed in a first layer of the multilayer wiring layer. In that case, the first control line layer is formed in a second layer of the multilayer wiring layer.

According to the above configuration, wiring capacitances with the transfer wiring and with the capacitance control wiring can be formed near the floating diffusion.

In the above configuration, in the multilayer wiring layer, the second control line layer may be formed in a manner to be separated from the FD connection layer by three or more layers.

According to the above configuration, influences, on the floating diffusion, of the feedthroughs due to the reset signal and the row selection signal can be reduced.

In the above configuration, the multilayer wiring layer may further include a constant voltage wiring layer. The constant voltage wiring layer includes a reference potential wiring on which a reference potential is applied. Further, the constant voltage wiring layer is formed between the first control line layer and the second control line layer.

The feedthrough is caused by a voltage variation around the wiring capacitance. In other words, fundamentally, no feedthrough is caused, due to the constant voltage wiring layer. With a configuration in which a wiring layer which does not cause the feedthrough is placed closer to the floating diffusion than the second control line layer, the potential reduction of the floating diffusion by the feedthrough can be suppressed.

In the above configuration, the at least one wafer may include a pixel unit wafer and a logic circuit unit wafer. In that case, the photodiode, the floating diffusion, and the transfer transistor are formed on the pixel unit wafer. The reset transistor and the source follower transistor are formed on the logic circuit unit wafer. The FD connection layer is formed in a first layer of the multilayer wiring layer of the pixel unit wafer. The first control line layer is formed in a second layer of the multilayer wiring layer of the pixel unit wafer. The second control line layer is formed in the multilayer wiring layer of the logic circuit unit wafer. The multilayer wiring layer of the logic circuit unit wafer is laminated in an opposing manner over the multilayer wiring layer of the pixel unit wafer.

According to the above configuration, wiring and terminals, in which the feedthrough, which would reduce the potential of the floating diffusion, occurs, are placed in the logic circuit unit wafer. Accordingly, the potential reduction by the feedthrough is suppressed in the floating diffusion formed in the pixel unit wafer.

In the above configuration, the multilayer wiring layer may further include a constant voltage wiring layer. The constant voltage wiring layer includes a reference potential wiring on which a reference potential is applied. The second control line layer is formed in a first layer of the multilayer wiring layer of the logic circuit unit wafer. The constant voltage wiring layer is formed in a second layer of the multilayer wiring layer of the logic circuit unit wafer. The constant voltage wiring layer on the logic circuit unit wafer is laminated over the first control line layer on the pixel unit wafer.

In the above configuration, the at least one wafer may include a pixel unit wafer and a logic circuit unit wafer. In that case, the photodiode, the floating diffusion, the source follower transistor, and the transfer transistor are formed on the pixel unit wafer. The reset transistor and the row selection transistor are formed on the logic circuit unit wafer. The FD connection layer is formed in a first layer of the multilayer wiring layer of the pixel unit wafer. The first control line layer is formed in a second layer of the multilayer wiring layer of the pixel unit wafer. The second control line layer is formed in the multilayer wiring layer of the logic circuit unit wafer. The multilayer wiring layer of the logic circuit unit wafer is laminated in an opposing manner over the multilayer wiring layer of the pixel unit wafer.

In the above configuration, an additional capacitance, and a selective conversion gain transistor may be formed on the wafer. The selective conversion gain transistor is provided between the additional capacitance and the floating diffusion. The wirings formed in the multilayer wiring layer further include a selective conversion gain transistor wiring. On the selective conversion gain transistor wiring, a selective conversion gain signal for the selective conversion gain transistor is transmitted.

An image sensor disclosed herein includes at least one wafer, and a multilayer wiring layer. A photodiode, a transfer transistor, a floating diffusion, a reset transistor, and a source follow transistor are formed on the wafer. The photodiode photoelectrically converts incident light. The transfer transistor transfers charges photoelectrically converted by the photodiode. The floating diffusion temporarily holds charges transferred from the transfer transistor. The reset transistor resets a potential of the floating diffusion to a reference potential. The source follower transistor has a gate connected to the floating diffusion. The multilayer wiring layer is laminated over the wafer. Wirings formed in the multilayer wiring layer include a transfer wiring, a capacitance control wiring, a reset wiring, and an FD-SF wiring. On the transfer wiring, a transfer signal for the transfer transistor is transmitted. The capacitance control wiring is capacitively coupled with the floating diffusion. On the capacitance control wiring, a boost signal which increases the potential of the floating diffusion is transmitted. On the reset wiring, a reset signal for the reset transistor is transmitted. The FD-SF wiring connects the floating diffusion and the source follower transistor. In the multilayer wiring layer, the transfer wiring, the capacitance control wiring, and the reset wiring are formed in a single layer. The transfer wiring and the capacitance control wiring have wider wiring widths than the reset wiring.

As shown, at the time t2 in FIG. 2 to be described later, when the reset signal is switched (RST: Hi→Lo), the potential of the floating diffusion is reduced (i.e., the well is shallowed) by the feedthrough. As shown at times t3 and t4 of FIG. 2, when the boost signal and the transfer signal are transmitted, the potential of the floating diffusion is increased by the feedthrough. With the configuration in which the wiring widths of the transfer wiring and the capacitance control wiring are wider than the wiring width of the reset wiring, an amount of increase of the potential by the feedthrough can be enlarged. In addition, with the configuration in which the wiring width of the reset wiring is narrower than the wiring widths of the transfer wiring and the capacitance control wiring, reduction of the potential by the feedthrough can be suppressed.

In the above configuration, a row selection transistor which is connected to a source of the source follower transistor may be formed on the wafer. In that case, the wirings formed in the multilayer wiring layer further include a row selection wiring. On the row selection wiring, a row selection signal for the row selection transistor is transmitted. In the multilayer wiring layer, in addition to the transfer wiring, the capacitance control wiring, and the reset wiring, the row selection wiring is formed in the single layer. The row selection wiring has a narrower wiring width than the transfer wiring and the capacitance control wiring.

As shown, at the time t11 of FIG. 6 to be described later, when the row selection signal is transmitted (RS: Lo→Hi), the potential of the floating diffusion is reduced by the feedthrough (i.e., the well is shallowed). With the configuration in which the wiring width of the row selection wiring is narrower than the wiring widths of the transfer wiring and the capacitance control wiring, reduction of the potential by the feedthrough can be suppressed.

The present specification further discloses an image sensor manufacturing method. In the manufacturing method, a photodiode, a floating diffusion, and a source follower transistor are formed on at least one wafer. The photodiode photoelectrically converts incident light. The floating diffusion temporarily holds charges accumulated in the photodiode. The source follower transistor has a gate connected to the floating diffusion. In the manufacturing method, a multilayer wiring layer is laminated over the wafer. Wirings included in the multilayer wiring layer include a capacitance control wiring and an FD-SF wiring. The capacitance control wiring is capacitively coupled with the floating diffusion. On the capacitance control wiring, a boost signal is transmitted. The boost signal increases a potential of the floating diffusion. The FD-SF wiring connects the floating diffusion and the source follower transistor. As the multilayer wiring layer, an FD connection layer and a first control line layer are formed. The first control line layer is placed closest to the FD connection layer among the wiring layers of the multilayer wiring layer.

In the above configuration, a transfer transistor may be formed on the wafer. The transfer transistor transfers charges photoelectrically converted by the photodiode to the floating diffusion. A transfer wiring is formed in the first control line layer. On the transfer wiring, a transfer signal for the transfer transistor is transmitted.

In the above configuration, a reset transistor may be formed in the image sensor. The reset transistor resets the potential of the floating diffusion to a reference potential. The wirings formed in the multilayer wiring layer further include a reset wiring. On the reset wiring, a reset signal for the reset signal is transmitted. As the multilayer wiring layer, a second control line layer is formed. In the second control line layer, the reset wiring is formed.

In the above configuration, a row selection transistor may be formed in the image sensor. The row selection transistor is connected to a source of the source follower transistor. A row selection wiring is formed in the second control line layer. On the row selection wiring, a row selection signal for the row selection transistor is transmitted.

In the above configuration, the at least one wafer may include a pixel unit wafer and a logic circuit unit wafer. In that case, the photodiode, the floating diffusion, and the transfer transistor are formed on the pixel unit wafer. The reset transistor and the source follower transistor are formed on the logic circuit unit wafer. The FD connection layer is formed in a first layer of the multilayer wiring layer of the pixel unit wafer. The first control line layer is formed in a second layer of the multilayer wiring layer of the pixel unit wafer. The second control line layer is formed in the multilayer wiring layer of the logic circuit unit wafer. The multilayer wiring layer of the logic circuit unit wafer is laminated in an opposing manner over the multilayer wiring layer of the pixel unit wafer.

The present specification further discloses an image sensor manufacturing method. In the manufacturing method, a photodiode, a transfer transistor, a floating diffusion, a reset transistor, and a source follower transistor are formed on at least one wafer. The photodiode photoelectrically converts incident light. The transfer transistor transfers charges photoelectrically converted by the photodiode. The floating diffusion temporarily holds charges transferred from the transfer transistor. The reset transistor resets a potential of the floating diffusion to a reference potential. The source follower transistor has a gate connected to the floating diffusion. A multilayer wiring layer is laminated over the wafer. Wirings formed in the multilayer wiring layer include a transfer wiring, a capacitance control wiring, a reset wiring, and an FD-SF wiring. On the transfer wiring, a transfer signal for the transfer transistor is transmitted. The capacitance control wiring is capacitively coupled with the floating diffusion. On the capacitance control wiring, a boost signal is transmitted. The boost signal increases the potential of the floating diffusion. On the reset wiring, a reset signal for the reset transistor is transmitted. The FD-SF wiring connects the floating diffusion and the source follower transistor. In the multilayer wiring layer, the transfer wiring, the capacitance control wiring, and the reset wiring are formed in a single layer. The transfer wiring and the capacitance control wiring have wider wiring widths than the reset wiring.

According to the image sensor and the image sensor manufacturing method disclosed herein, lag and injection can be suppressed while suppressing the feedthrough which reduces the potential of the floating diffusion.

BRIEF DESCRIPTION OF DRAWINGS

Embodiment(s) of the present disclosure will be described based on the following figures, wherein.

DESCRIPTION OF EMBODIMENTS

An image sensor and its manufacturing method are described below by reference to the drawings. The shapes, materials, numbers of items, and numerical values described below are referred to simply by way of example. Those shapes and the like can be changed as appropriate in accordance with specifications of the image sensor. In the following description, identical elements in all of the drawings are assigned the same reference signs.

Figure 7:
FIG. 7 is a plan view showing an example wiring structure of an image sensor according to a first embodiment of the present disclosure.
Figure 7:
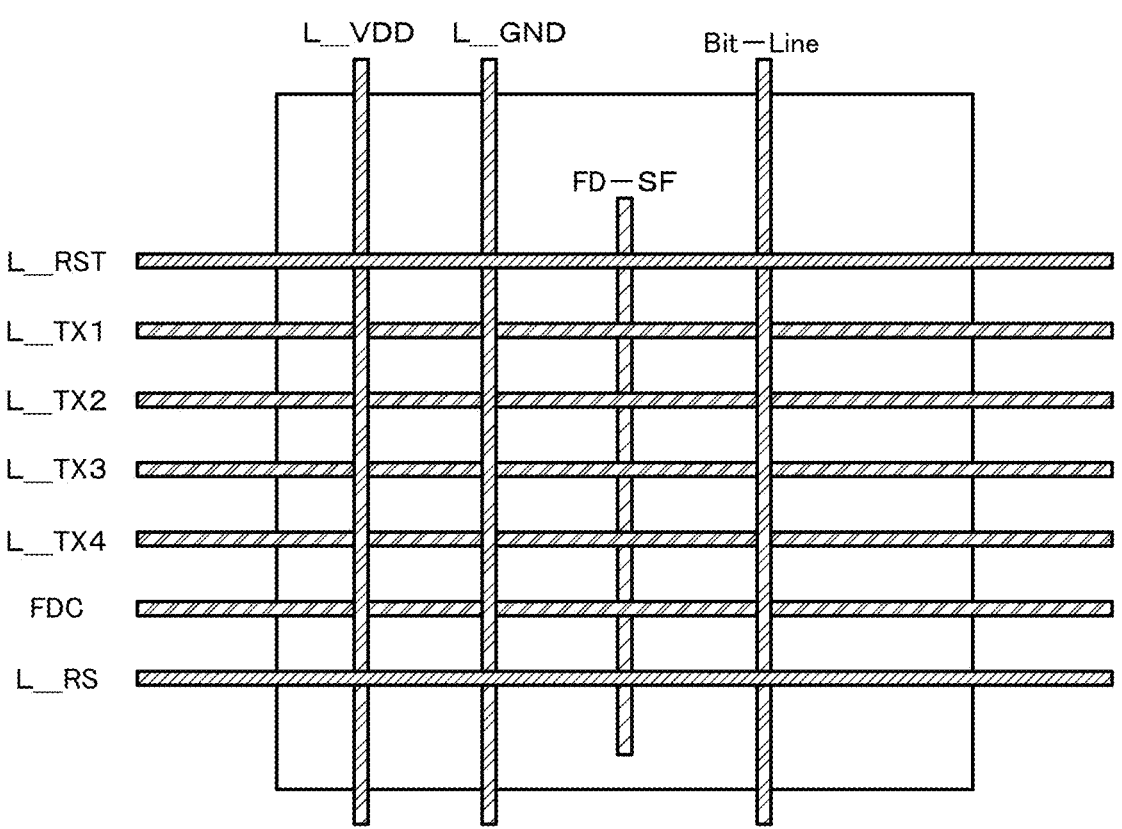
Figure 8:
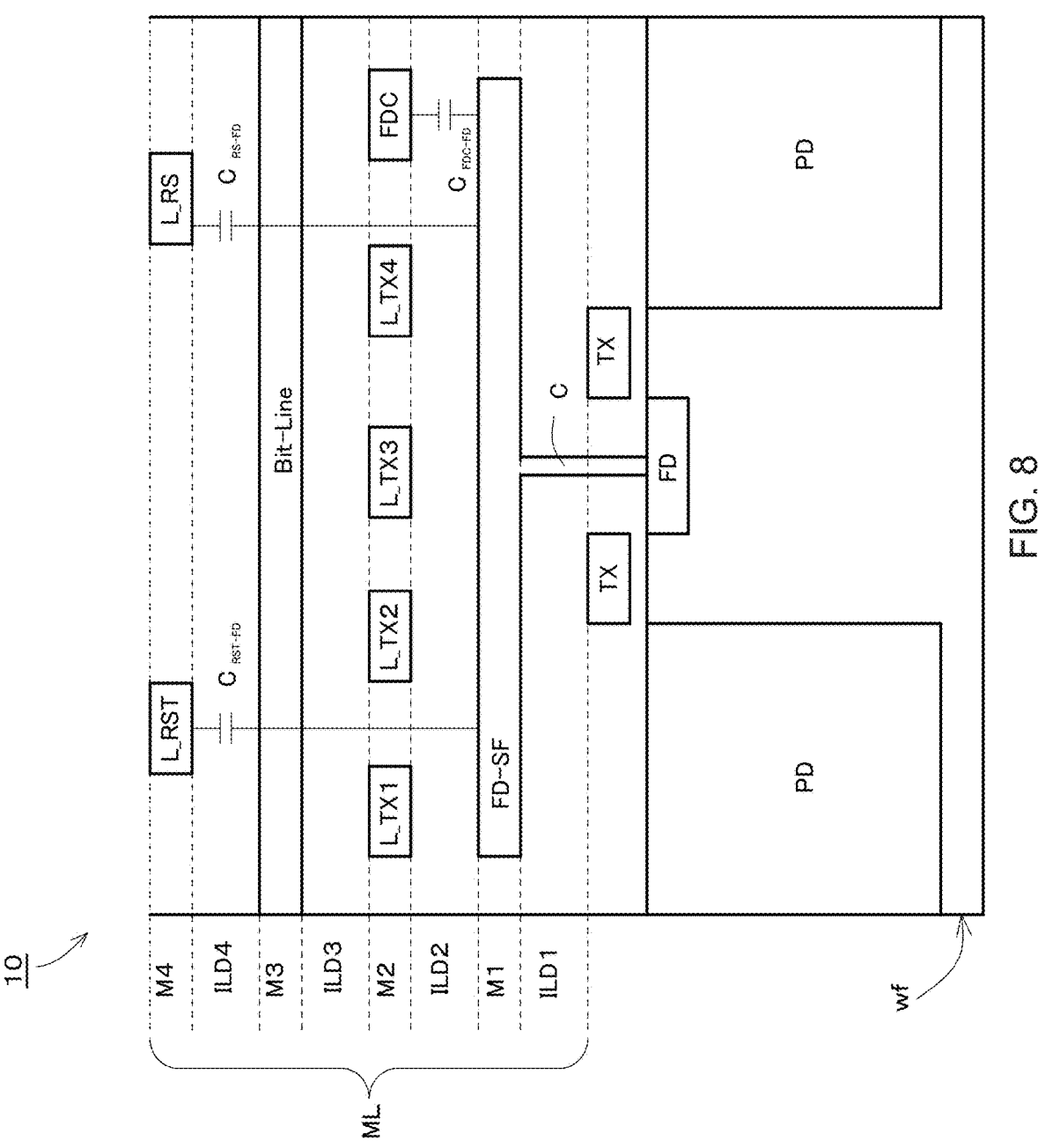
FIG. 8 is a cross-sectional view showing an example structure of the image sensor according to the first embodiment of the present disclosure.
Figure 9:
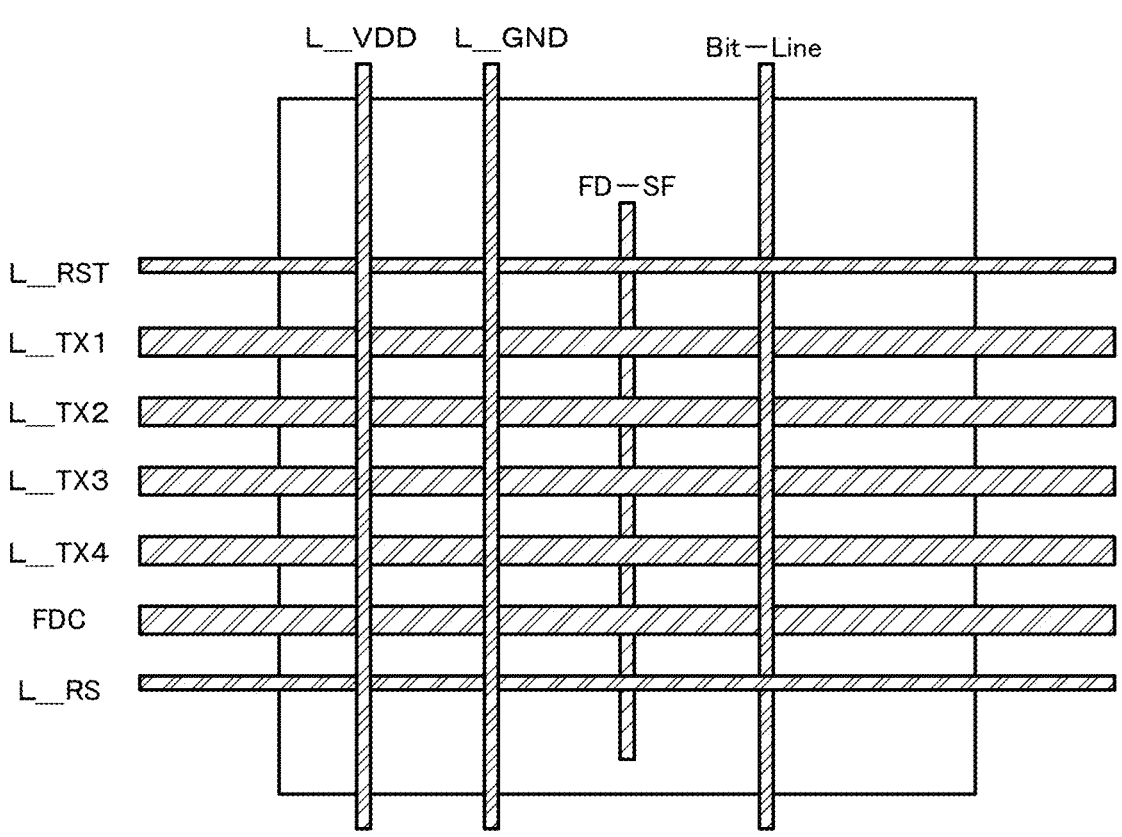
FIG. 9 is a plan view showing an example wiring structure of an image sensor according to a second embodiment of the present disclosure.
Figure 17:
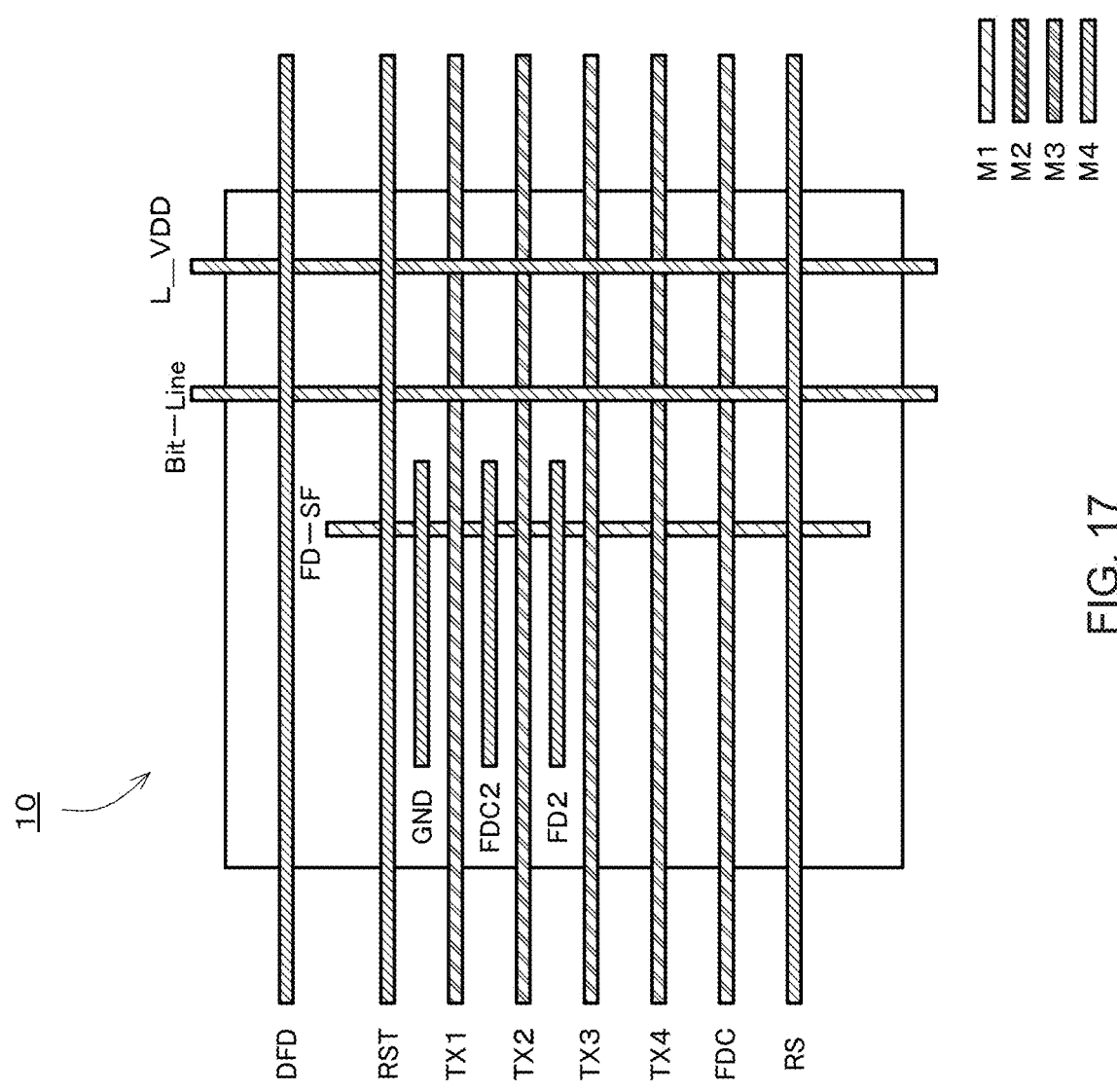
FIG. 17 is a plan view showing an example wiring structure of the image sensor according to the fourth embodiment of the present disclosure.

FIGS. 7, 9, and 17 show plan views of an image sensor 10 according to embodiments of the present disclosure. FIGS. 8, 10, 12, 14, and 18 show cross-sectional views of the image sensor 10 according to the embodiments of the present disclosure. The cross-sectional view shows a vertical cross section with respect to the plan view.

1. Circuit Structure

Figure 1:
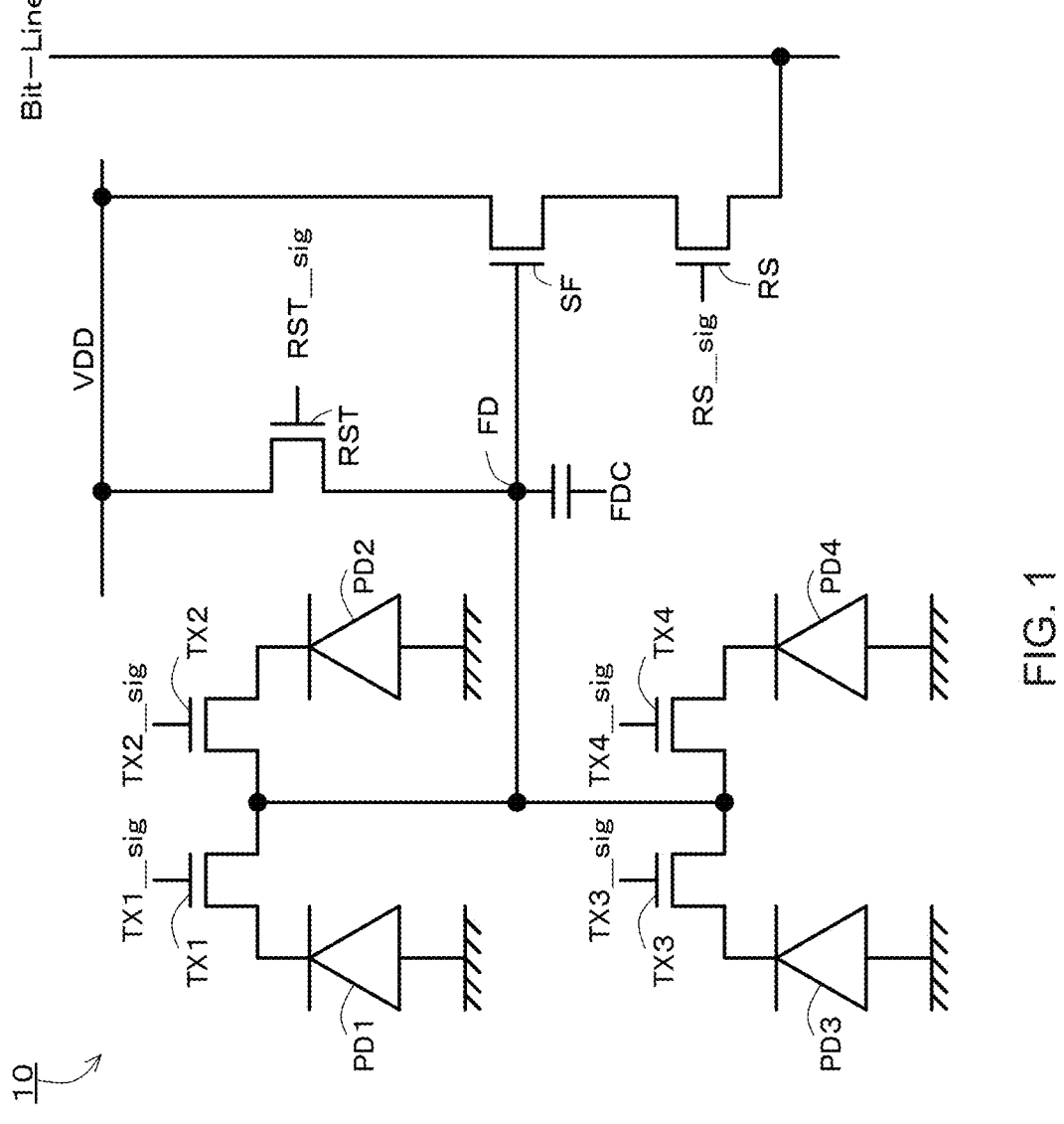
FIG. 1 is a diagram showing an example circuit structure of an image sensor according to an embodiment of the present disclosure.

FIG. 1 is a circuit diagram showing an example circuit of the image sensor 10 according to first through third embodiments of the present disclosure. The image sensor 10 is formed from a CMOS (Complementary Metal Oxide Semiconductor) image sensor. The image senor 10 is a so-called shard pixel type image sensor. That is, in the image sensor 10, a plurality of photodiodes PD1-PD4 share a floating diffusion amplifier. With such a circuit structure, the number of transistors per pixel can be reduced.

With reference to FIG. 1, the photodiodes PD1-PD4 photoelectrically convert incident light. Transfer transistors TX1-TX4 respectively transfer charges photoelectrically converted by the photodiodes PD1-PD4 to a floating diffusion FD. The floating diffusion FD temporarily holds the charges accumulated in the photodiodes PD1-PD4. A reset transistor RST resets a potential of the floating diffusion FD to a reference potential VDD. In a source follower transistor SF, a gate is opened according to a potential of the floating diffusion FD. A row selection transistor outputs a signal (voltage signal) on a bit line when a row selection signal RS_sig is applied to a gate thereof.

The photodiodes PD1-PD4 are connected respectively via the transfer transistors TX1-TX4 to the floating diffusion FD. The floating diffusion FD is connected to the gate of the source follower transistor SF. In addition, the floating diffusion FD is connected to a source of the reset transistor RST. Drains of the source follower transistor SF and the reset transistor RST are connected to a reference potential wiring L_VDD. A source of the source follower transistor is connected to a drain of the row selection transistor RS. A source of the row selection transistor RS is connected to the bit line.

A wiring capacitance is caused between the floating diffusion FD and a capacitance control wiring FDC. For example, on the capacitance control wiring FDC, a boost signal which is a voltage signal is transmitted. As shown, at a time t3 of FIG. 2 to be described later, when the boost signal is output (FDC: Lo→Hi), the potential of the floating diffusion FD during the charge transfer is temporarily increased.

Figure 2:
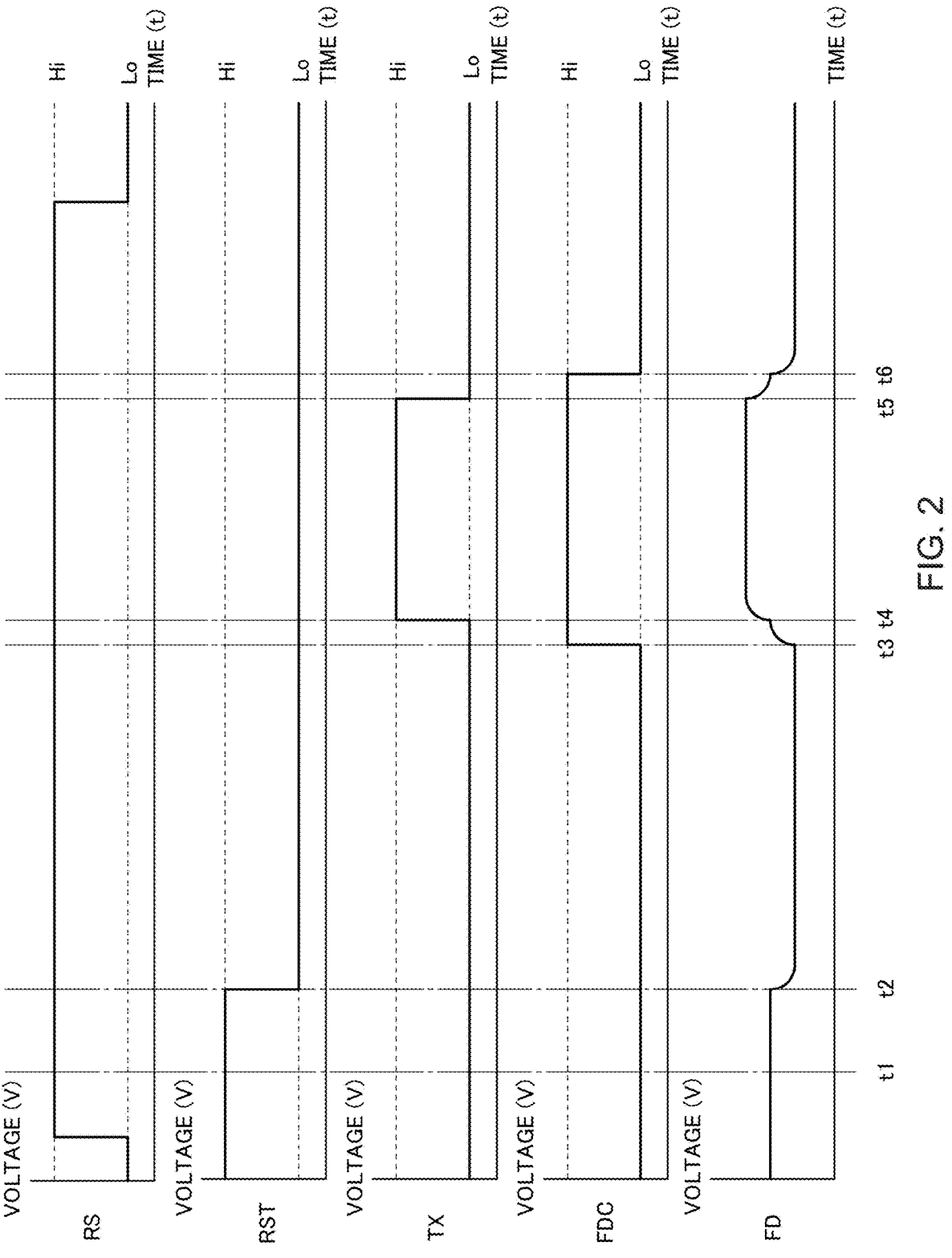
FIG. 2 is a diagram showing a timing chart of the image sensor according to the embodiment of the present disclosure.
Figure 3:
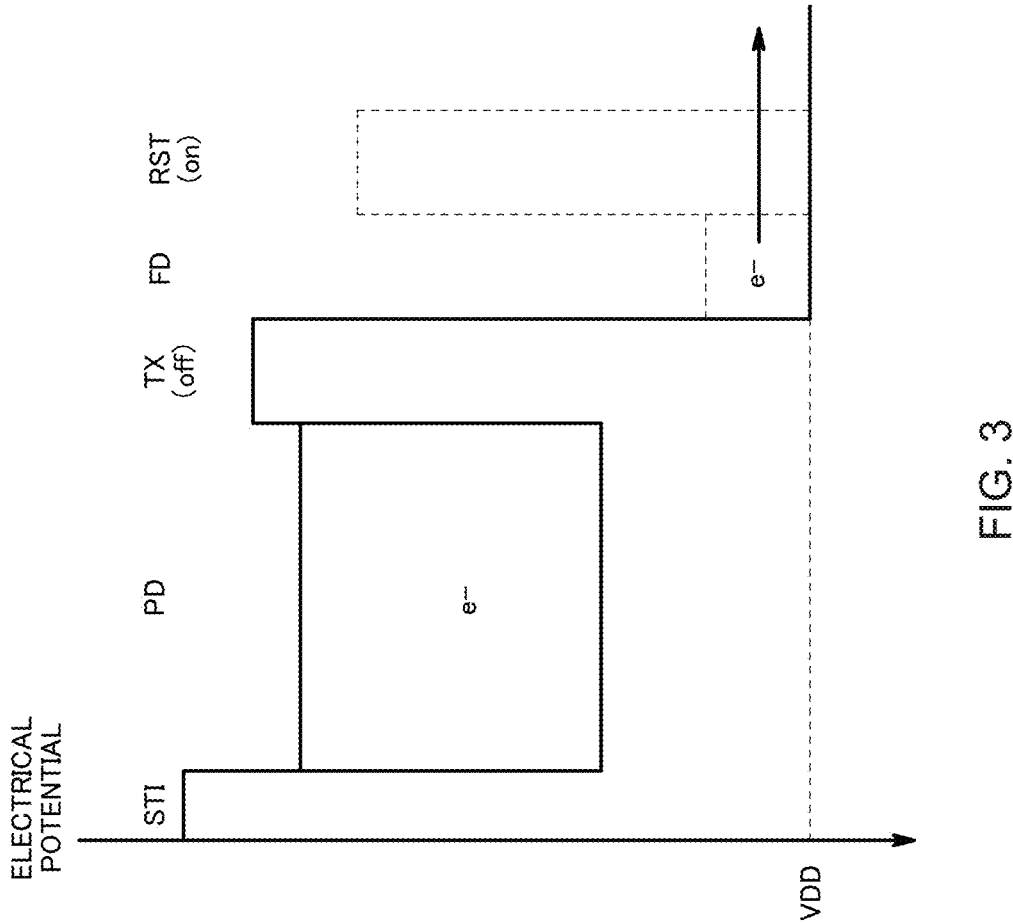
FIG. 3 is a diagram for explaining a process (1/3) of charge transfer.

FIG. 2 shows an example timing chart for explaining operations of various terminals of the image sensor 10. With reference to FIGS. 2 and 3, at a time t1, the reset transistor RST is set to an ON state (Hi). With this process, the floating diffusion FD is reset to the reference potential VDD. In addition, in the photodiodes PD1-PD4, charges are accumulated through photoelectric conversion.

Figure 4:
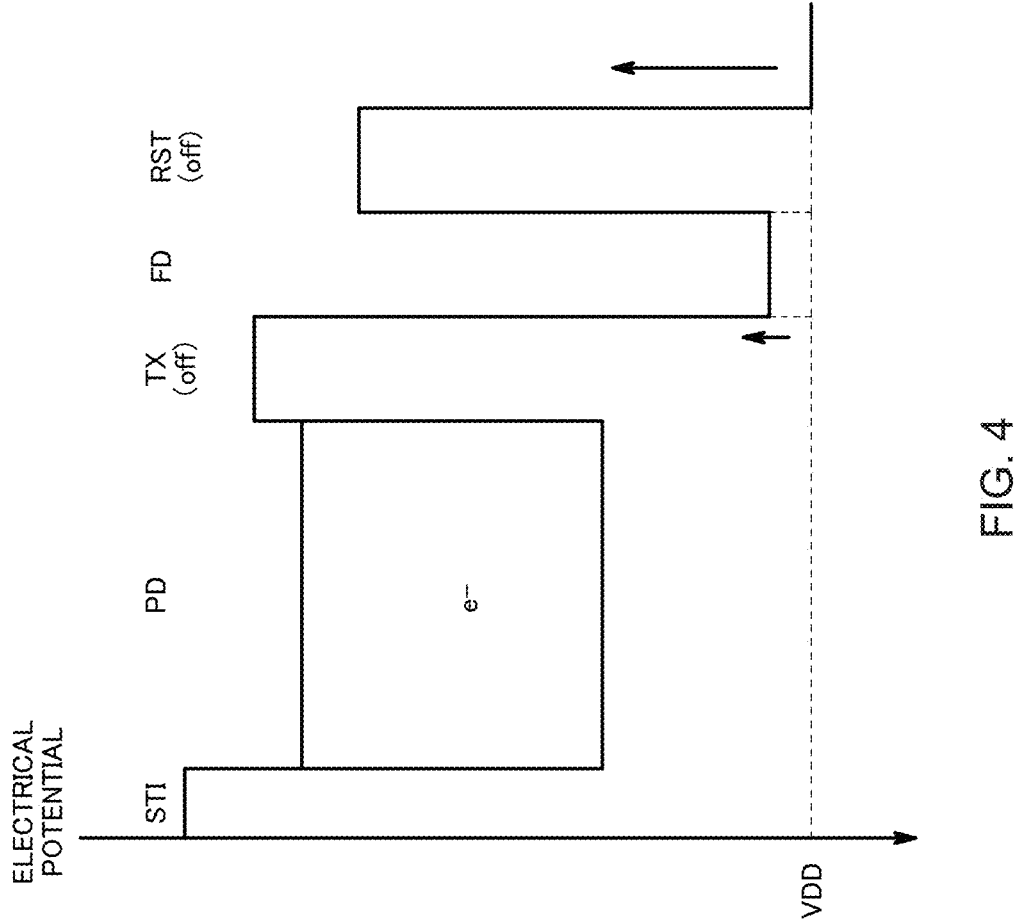
FIG. 4 is a diagram for explaining a process (2/3) of charge transfer.

With reference to FIGS. 2 and 3, at the time t2, the reset transistor RST is switched from the ON state to the OFF state (Lo). In this process, a feedthrough occurs via a parasitic capacitance formed between the reset transistor RST and the floating diffusion FD. That is, as shown in FIG. 4, with a change of the voltage (reset signal) on the reset wiring L_RST (refer to FIG. 7) connected to the reset transistor RST from Hi to Lo, the potential of the floating diffusion FD is reduced.

With reference to FIG. 2, at a time t3, the capacitance control wiring FDC is switched from the OFF state (Lo) to the ON state (Hi). That is, a predetermined boost signal (voltage signal) is applied to the capacitance control wiring FDC. With this process, the potential of the floating diffusion FD is increased (i.e., the well is deepened) via a parasitic capacitance between the floating diffusion FD and the capacitance control wiring FDC.

Figure 5:
FIG. 5 is a diagram for exampling a process (3/3) of charge transfer.

With reference to FIGS. 2 and 5, at a time t4, at least one of the transfer transistors TX1-TX4 is switched from the OFF state (Lo) to the ON state (Hi). In this process, a feedthrough occurs via parasitic capacitances formed between the transfer transistors TX1-TX4 and the floating diffusion FD. That is, with the change of the voltage of at least one of transfer wirings L_TX1-L_TX4 (refer to FIG. 7) connected to the transfer transistors TX1-TX4 from Lo to Hi, the potential of the floating diffusion FD is increased (i.e., the well is deepened).

At times t3 and t4, during the charge transfer, the potential of the floating diffusion FD is temporarily increased. With this process, as shown in FIG. 5, potential differences between the photodiodes PD1-PD4 (which are simply described as "PD" in FIG. 5) and the floating diffusion FD are enlarged. As a result, occurrence of lag and injection can be suppressed.

Then, at a time t5, the transfer transistors TX1-TX4 are switched from the ON state to the OFF state. In this process, the potential of the floating diffusion FD is reduced (i.e., the well is shallowed) by the feedthrough.

At a time t6, the capacitance control wiring FDC is switched from the ON state to the OFF state. In this process, the potential of the floating diffusion FD is reduced (i.e., the well is shallowed) by the feedthrough.

That is, at times after t6, charges are detected with a high conversion gain. As described above, in the image sensor 10 of the present embodiment, when charges are transferred from the photodiodes PD1-PD4 to the floating diffusion FD, the potential of the floating diffusion FD is temporarily increased. With this configuration, the lag and the injection during the charge transfer can be suppressed while securing a high conversion gain.

Figure 6:
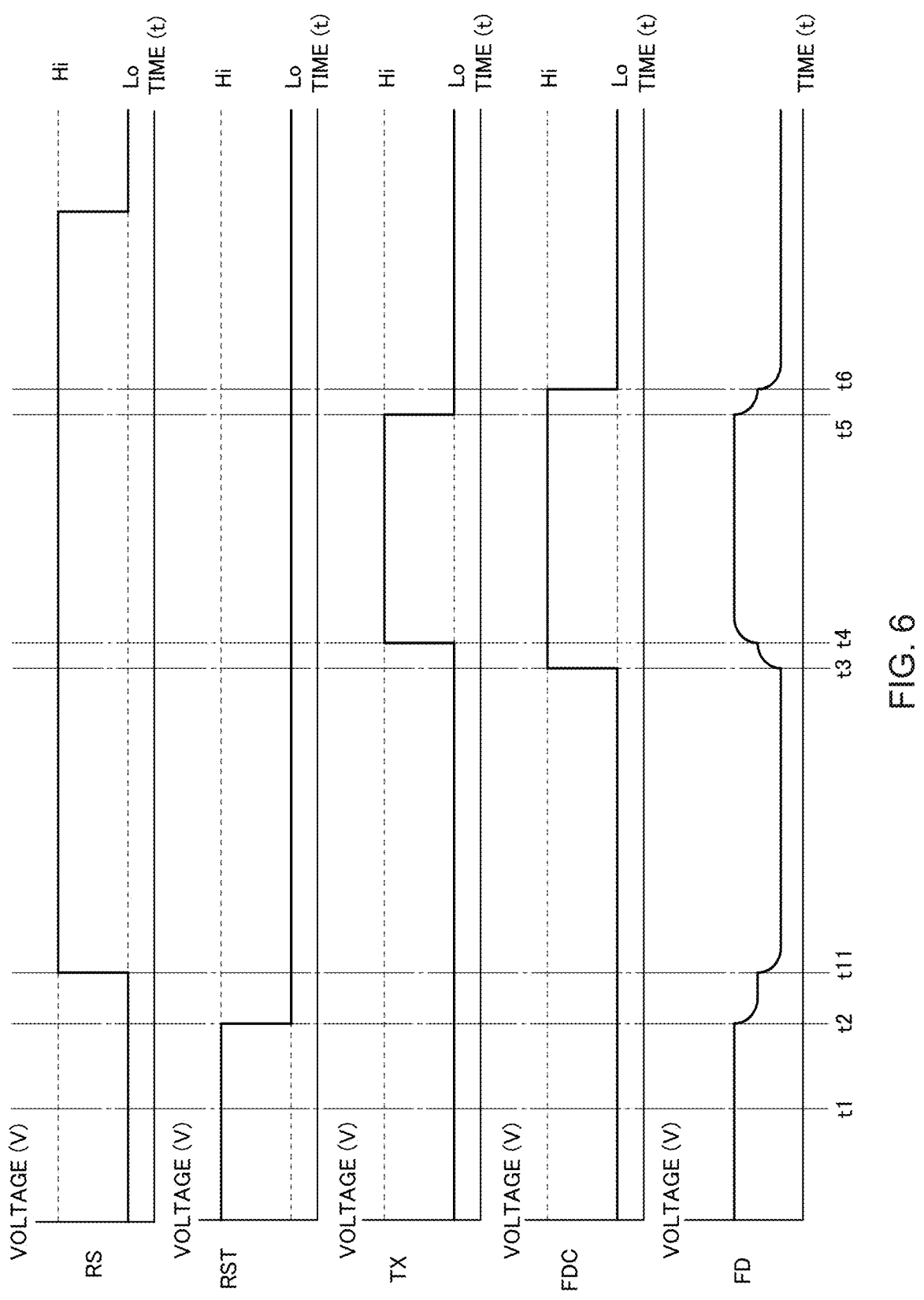
FIG. 6 is a diagram showing a timing chart (with row selection) of the image sensor according to the embodiment of the present disclosure.

FIG. 6 shows a timing chart different from FIG. 2. In FIG. 6, the row selection transistor RS is switched from the OFF state to the ON state at a time t11. In FIG. 6, operations of elements other than the row selection transistor are similar to those in the timing chart of FIG. 2.

When the row selection transistor RS is switched from the OFF state to the ON state at the time t11, a feedthrough occurs via a parasitic capacitance formed between the row selection transistor RS and the floating diffusion FD. That is, with a change of the voltage of the row selection wiring L_RS (refer to FIG. 7) connected to the row selection transistor RS from Lo to Hi, the potential of the floating diffusion FD is reduced (i.e., the well is shallowed).

With reference to the timing charts of FIGS. 2 and 6, between the time t4 and the time t6, the charges stored in the photodiodes PD1-PD4 are transferred to the floating diffusion FD. Prior to the charge transfer, the potential of the floating diffusion FD is reduced (i.e., the well is shallowed) due to the feedthroughs caused by the operation of the reset transistor RST (time t2) and the operation of the row selection transistor (time t11). In addition, due to the transmission of the boost signal on the capacitance control wiring FDC (time t3), and the feedthroughs caused by the operations of the transfer transistors TX1-TX4 (time t4), the potential of the floating diffusion FD is increased (i.e., the well is deepened).

As described, during the charge transfer for transferring charges from the photodiodes PD1-PD4 to the floating diffusion FD, the potential of the floating diffusion FD must be temporarily increased. The potential of the floating diffusion FD during the charge transfer is reduced by the operation of the reset transistor RST (time t2) and the operation of the row selection transistor (time t11). On the other hand, with the transmission of the boost signal on the capacitance control wiring FDC (time t3) and the operations of the transfer transistors TX1-TX4 (time t4), the potential of the floating diffusion FD during the charge transfer is increased.

Accordingly, in first through fourth embodiments of the present disclosure described below, a wiring layout is employed which results in a relatively low wiring capacitance between the reset transistor RST and the floating diffusion FD and a relatively low wiring capacitance between the row selection transistor RS and the floating diffusion FD. In addition, in the first through fourth embodiments of the present disclosure, a wiring layout is employed which results in relatively high wiring capacitances between the capacitance control wiring FDC and the transfer transistors TX1-TX4.

2. First Embodiment

FIGS. 7 and 8 show the image sensor 10 according to the first embodiment. FIG. 7 shows a plan view of the image sensor 10, and FIG. 8 shows a cross-sectional view of the image sensor. In FIG. 7, wirings formed respectively in wiring layers M1, M2, M3, and M4 are shown with hatching patterns different from each other.

The image sensor 10 includes a wafer wf and a multilayer wiring layer ML. For example, the image sensor 10 is a backside illuminated CMOS image sensor.

A pixel terminal and a logic circuit terminal of the image sensor 10 are formed on the wafer wf. Specifically, the photodiode PD, the transfer transistor TX, and the floating diffusion FD are formed on the wafer wf.

The multilayer wiring layer ML is laminated over the wafer wf. The multilayer wiring layer ML includes a plurality of wiring layers M1, M2, M3, and M4. In the wiring layers M1, M2, M3, and M4, wirings are formed horizontally along a surface of the wafer wf.

The multilayer wiring layer ML further includes a plurality of interlayer insulation films ILD1, ILD2, ILD3, and ILD4. The interlayer insulation films ILD1, ILD2, ILD3, and ILD4 are placed between respective layers including the wafer wf and the wiring layers M1, M2, M3, and M4. In the interlayer insulation films ILD1, ILD2, ILD3, and ILD4, a contact C and a via (not shown) are formed. The contact C and the via extend vertically with respect to the surface of the wafer wf.

Of the multilayer wiring layer ML, in the first wiring layer M1, an FD-SF wiring is formed. The FD-SF wiring is a wiring which connects the floating diffusion FD and the source follower transistor SF (refer to FIG. 1). For example, the FD-SF wiring is connected via the contact C to the floating diffusion FD. Because the FD-SF wiring is formed therein, the first wiring layer M1 will hereinafter also be referred to as an "FD connection layer" as appropriate.

In the second wiring layer M2, the transfer wirings L_TX1, L_TX2, L_TX3, and L_TX4, and the capacitance control wiring FDC are formed. The transfer wirings L_TX1, L_TX2, L_TX3, and L_TX4 are connected respectively to the transfer transistors TX1, TX2, TX3, and TX4. On the transfer wirings L_TX1, L_TX2, L_TX3, and L_TX4, transfer signals TX1_sig-TX4_sig, which are ON/OFF signals (voltage signals) for the transfer transistors TX1, TX2, TX3, and TX4, are respectively transmitted.

The capacitance control wiring FDC is capacitively coupled with the floating diffusion FD. On the capacitance control wiring FDC, a boost signal which is a voltage signal is transmitted. When the boost signal is applied on the capacitance control wiring FDC, the potential of the floating diffusion FD is temporarily increased. The second wiring layer M2 will hereinafter also be referred to as a "first control line layer" as appropriate.

In the third wiring layer M3, the bit line is formed. With reference to FIG. 7, in the wiring layer M3, a reference potential wiring L_VDD and a ground wiring L_GND are formed. Although the voltage of the bit line varies, because the third wiring layer M3 includes the reference potential wiring L_VDD and the ground wiring L_GND which are constant potential wirings, the third wiring layer M3 is also referred to as a "constant voltage wiring layer".

In the fourth wiring layer M4, a reset wiring L_RST and a row selection wiring L_RS are formed. The reset wiring L_RST is connected to the reset transistor RST. On the reset wiring L_RST, a reset signal RST_sig, which is an ON/OFF signal (voltage signal) for the reset transistor RST, is transmitted. On the row selection wiring L_RS, a row selection signal RS_sig, which is an ON/OFF signal for the row selection transistor RS, is transmitted. The fourth wiring layer M4 will hereinafter also be referred to as a "second control line layer" as appropriate.

With reference to FIG. 8, a wiring capacitance is caused between the wirings formed in the multilayer wiring layer ML and the FD-SF wiring. In the multilayer wiring layer ML, the first control line layer M2 is the wiring layer which is the closest to the FD connection layer M1. Therefore, wiring capacitances $C_{FDC\text{-}FD}$ (parasitic capacitances) between the transfer wirings L_TX1, L_TX2, L_TX3, and L_TX4 and the capacitance control wiring FDC, which are formed in the first control line layer M2, and the FD-SF wiring are set to relatively large values.

With reference to FIG. 7, the FD-SF wiring intersects the transfer wirings L_TX1, L_TX2, L_TX3, and L_TX4, and the capacitance control wiring FDC in the circuit plan view. Thus, the distances between the FD-SF wiring and the transfer wiring L_TX1, L_TX2, L_TX3, and L_TX4, and between the FD-SF wiring and the capacitance control wiring FDC are equal to each other.

The second control line layer M4 is placed far away from the FD connection layer M1. For example, the second control line layer M4 is formed in a manner to be separated from the FD connection layer M1 by three or more layers. With such a layer placement, wiring capacitances CRST-FD and CRS-FD (parasitic capacitances) between the reset wiring L_RST and the row selection wiring L_RS, which are formed in the second control line layer M4, and the FD-SF wiring are set to relatively small values.

In this manner, in the image sensor 10 according to the first embodiment of the present disclosure, the control line layer is separated into two layers. That is, the wirings that cause the feedthroughs that temporarily increase the potential of the floating diffusion FD (i.e., which deepen the well) are formed in the first control line layer M2.

On the other hand, the wirings that cause feedthroughs that temporarily reduce the potential of the floating diffusion FD (i.e., which shallow the well) are formed in the second control line layer M4. By placing the second control line layer M4 at a position far away from the FD-SF wiring, the potential variation due to the feedthrough can be suppressed.

3. Second Embodiment (Wide L_TX and Wide FDC)

Figure 10:
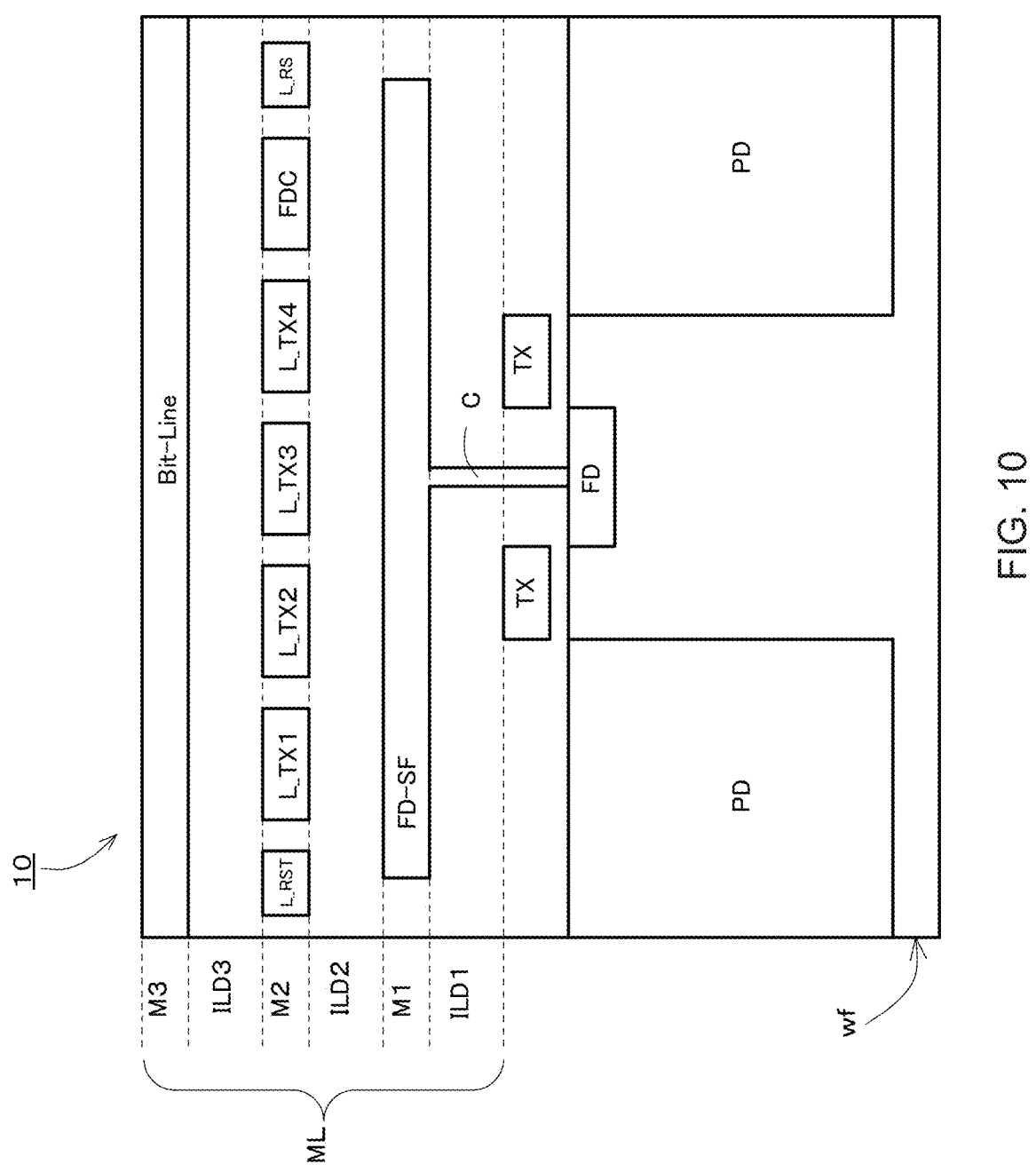
FIG. 10 is a cross-sectional view showing an example structure of the image sensor according to the second embodiment of the present disclosure.

FIGS. 9 and 10 show an image sensor 10 according to a second embodiment of the present disclosure. FIG. 9 shows a plan view of the image sensor 10, and FIG. 10 shows a cross-sectional view of the image sensor. In FIG. 9, wirings formed respectively in the wiring layers M1, M2, and M3 are shown with hatching patterns different from each other.

The image sensor 10 includes a wafer wf and a multilayer wiring layer ML. The wafer wf has the same structure as that in the first embodiment. Therefore, the wafer wf will now be repeatedly described in detail.

Of the multilayer wiring layer ML, a first wiring layer M1 is the FD connection layer, similar to the first embodiment. A third wiring layer M3 is the constant voltage wiring layer, similar to the first embodiment.

A second wiring layer M2 is a control line layer. That is, in the wiring layer M2, the transfer wirings L_TX1, L_TX2, L_TX3, and L_TX4, the capacitance control wiring FDC, the reset wiring L_RST, and the row selection wiring L_RS are formed. In other words, unlike the first embodiment, in the image sensor 10 of the second embodiment, the transfer wirings L_TX1, L_TX2, L_TX3, and L_TX4, the capacitance control wiring FDC, the reset wiring L_RST, and the row selection wiring L_RS are formed in a single layer.

In addition, in the wiring layer M2, the reset wiring L_RST and the row selection wiring L_RS have wiring widths that are narrower than wiring widths of the transfer wirings L_TX1, L_TX2, L_TX3, and L_TX4, and the capacitance control wiring FDC. In other words, the transfer wirings L_TX1, L_TX2, L_TX3, and L_TX4, and the capacitance control wiring FDC have wiring widths that are wider than the wiring widths of the reset wiring L_RST and the row selection wiring L_RS.

By setting the widths of the reset wiring L_RST and the row selection wiring L_RS to be narrow as a whole, the wiring capacitances between these wirings and the FD-SF wiring can be reduced. In addition, the wiring capacitances between the transfer wirings L_TX1, L_TX2, L_TX3, and L_TX4 and the FD-SF wiring, and between the capacitance control wiring FDC and the FD-SF wiring can be increased.

4. Third Embodiment (Image Sensor of 2-Wafer Type)

Figure 11:
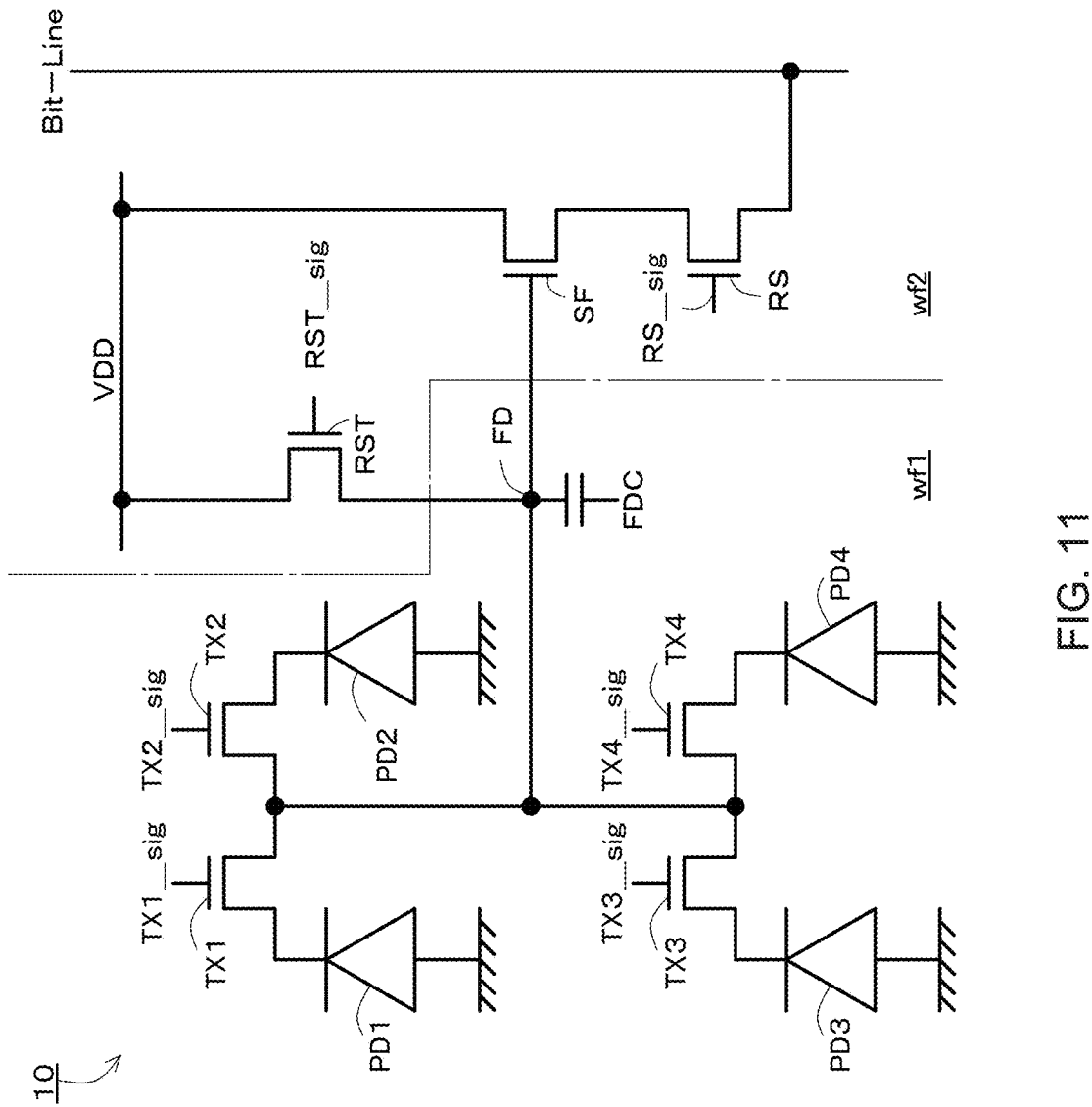
FIG. 11 is a diagram showing an example circuit structure of an image sensor according to a third embodiment of the present disclosure.
Figure 12:
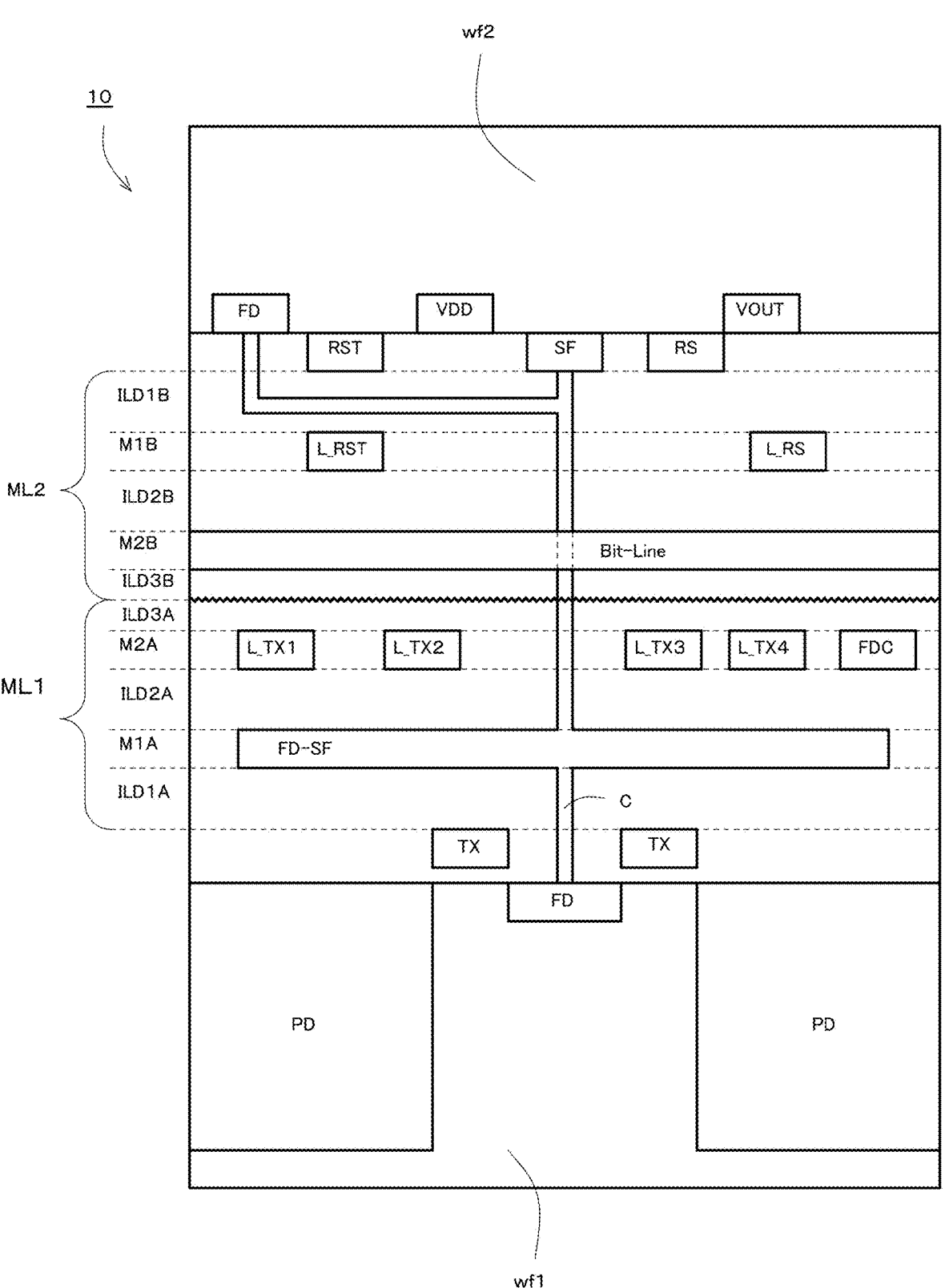
FIG. 12 is a cross-sectional view showing an example structure of the image sensor according to the third embodiment of the present disclosure.

FIGS. 11 and 12 show an image sensor 10 according to a third embodiment of the present disclosure. In this embodiment, an image sensor 10 of a two-wafer type is disclosed.

That is, the image sensor 10 includes a pixel unit wafer wf1 and a logic circuit unit wafer wf2. The pixel unit wafer wf1 has the same structure as the wafer wf in the first embodiment. Therefore, the pixel unit wafer wf1 will not be repeatedly described in detail.

In FIGS. 11 and 12, on the logic circuit unit wafer wf2, logic circuit terminals of the image sensor 10 are formed. For example, on the logic circuit unit wafer wf2, the source follower transistor SF, the reset transistor RST, and the row selection transistor RS are formed. For example, a surface of the pixel unit wafer wf1 on which the transfer transistors TX1-TX4 are formed, and a surface of the logic circuit unit wafer wf2 on which the source follower transistor SF or the like is formed are placed to oppose each other.

With reference to FIG. 12, over the pixel unit wafer wf1, a multilayer wiring layer ML1 is formed. A first layer M1A of the multilayer wiring layer ML1 is the FD connection layer. A second layer M2A is the first control line layer. The first control line layer has the same structure as the first control line layer in the first embodiment.

A multilayer wiring layer ML2 is formed also over the logic circuit unit wafer wf2. A first layer M1B of the multilayer wiring layer ML2 is the second control line layer. The second control line layer has the same structure as the second control line layer in the first embodiment.

A second layer M2B of the multilayer wiring layer ML2 is the constant voltage wiring layer, similar to the wiring layer M3 in the first embodiment. In the image sensor 10, the multilayer wiring layer ML1 of the pixel unit wafer wf1 and the multilayer wiring layer ML2 of the logic circuit unit wafer wf2 are laminated in a manner to oppose each other. That is, the layer M2B of the logic circuit unit wafer wf2 is laminated over the first control line layer M2A of the pixel unit wafer wf1. For example, an interlayer insulation film ILD3A at the uppermost layer of the pixel unit wafer wf1 and an interlayer insulation film ILD3B at the uppermost layer of the logic circuit unit wafer wf2 are adhered with each other.

According to the above configuration, the wirings and terminals at which the feedthroughs, which may lead to reduction of the potential of the floating diffusion FD, occur are placed on the logic circuit unit wafer wf2. With this configuration, the reduction of the potential due to the feedthrough can be suppressed in the floating diffusion FD formed on the pixel unit wafer wf1.

Figure 13:
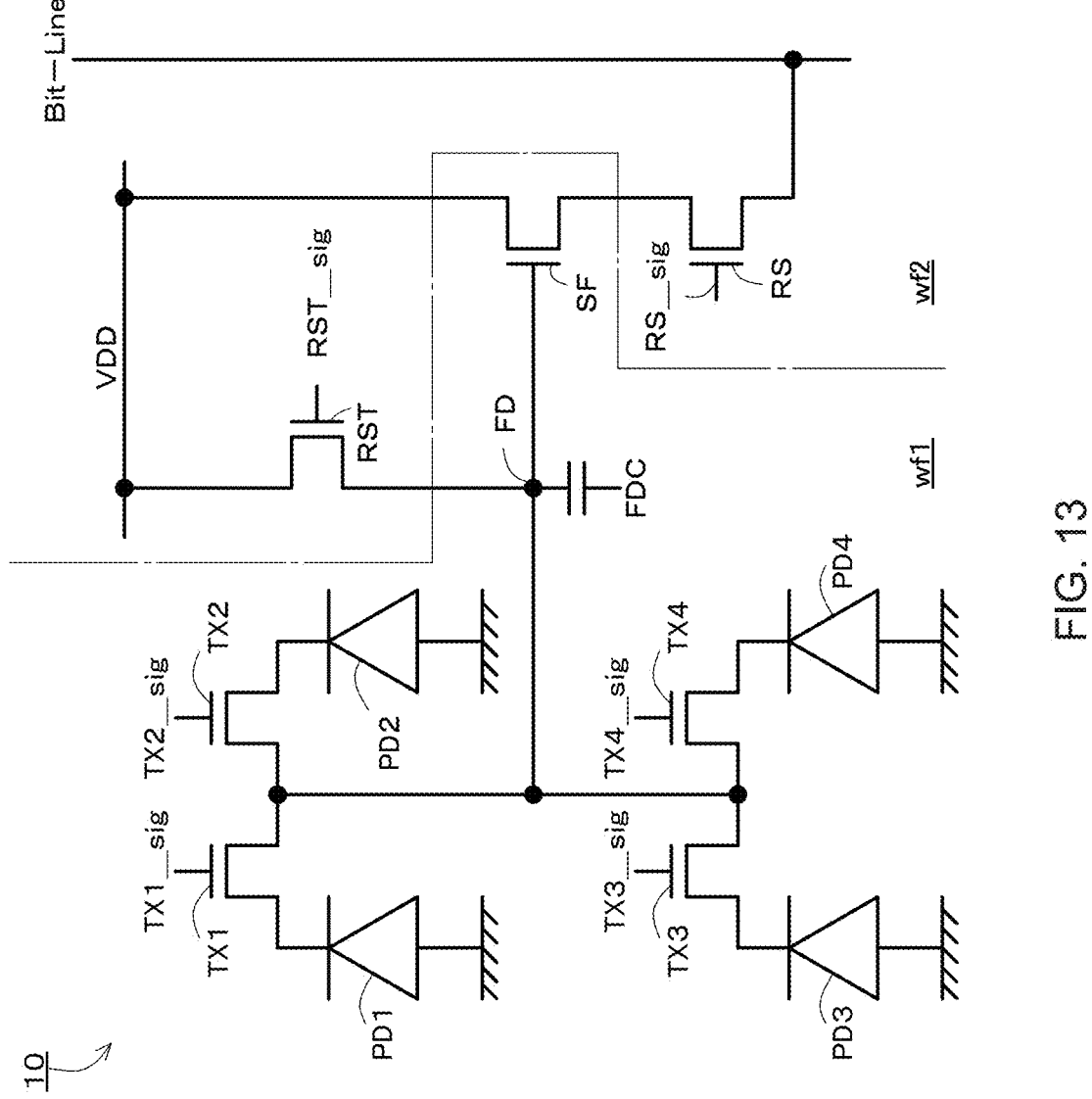
FIG. 13 is a diagram showing an example circuit structure of an image sensor according to an alternative configuration of the third embodiment of the present disclosure.
Figure 14:
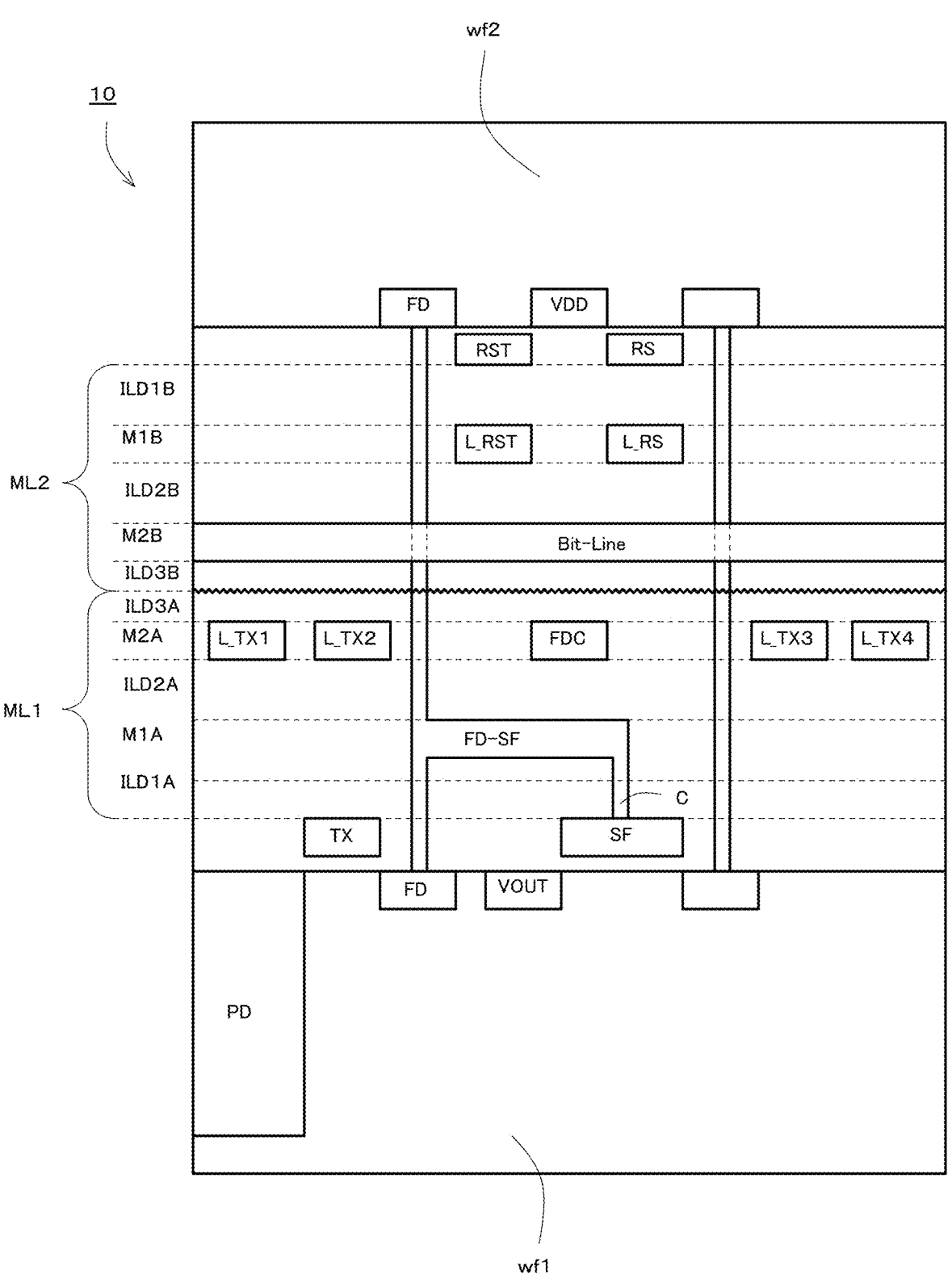
FIG. 14 is a cross-sectional view showing an example structure of the image sensor according to the alternative configuration of the third embodiment of the present disclosure.

FIGS. 13 and 14 show an image sensor 10 according to an alternative configuration of the third embodiment. In this embodiment also, similar to FIGS. 11 and 12, an image sensor 10 of a two-wafer type is disclosed.

On a logic circuit unit wafer wf2, logic circuit terminals of the image sensor 10 are formed. For example, on the logic circuit unit wafer wf2, a reset transistor RST and a row selection transistor RS are formed. For example, a surface of a pixel unit wafer wf1 on which transfer transistors TX1-TX4 and a source follower transistor SF are formed, and a surface of the logic circuit unit wafer wf2 on which the reset transistor RST and the row selection transistor RS are formed are placed in a manner to oppose each other.

A multilayer wiring layer ML1 is formed over the pixel unit wafer wf1. A first layer M1A of the multilayer wiring layer ML1 is an FD connection layer. A second layer M2A is the first control line layer. The first control line layer has the same structure as the first control line layer in the first embodiment.

A multilayer wiring layer ML2 is formed also over the logic circuit unit wafer wf2. A first layer M1B of the multilayer wiring layer ML2 is the second control line layer. The second control line layer has the same structure as the second control line layer in the first embodiment.

A second layer M2B of the multilayer wiring layer MHL2 is the constant voltage wiring layer identical to the wiring layer in the first embodiment. In the image sensor 10, the multilayer wiring layer ML1 of the pixel unit wafer wf1 and the multilayer wiring layer ML2 of the logic circuit unit wafer wf2 are laminated in a manner to oppose each other. That is, the constant voltage wiring layer M2B of the logic circuit unit wafer wf2 is laminated over the first control line layer M2A of the pixel unit wafer wf1. For example, the interlayer insulation film ILD3A at the uppermost layer of the pixel unit wafer wf1 and the interlayer insulation film ILD3B at the uppermost layer of the logic circuit unit wafer wf2 are adhered with each other.

According to the above configuration, the wirings and terminals at which feedthroughs, which may lead to reduction of the potential of the floating diffusion FD, occur are placed on the logic circuit unit wafer wf2. With this configuration, the reduction in the potential due to the feedthrough can be suppressed in the floating diffusion FD formed on the pixel unit wafer wf1.

A difference between the image sensor 10 shown in FIGS. 11 and 12 and the image sensor 10 shown in FIGS. 13 and 14 is in the placement of the source follower transistor SF. In the image sensor 10 shown in FIGS. 11 and 12, the source follower transistor SF is placed on the logic circuit unit wafer wf2. In the image sensor 10 shown in FIGS. 13 and 14, the source follower transistor SF is placed on the pixel unit wafer wf1 (refer to FIG. 14). Because the source follower transistor SF is affected by the second control line, in the image sensor shown in FIGS. 11 and 12, the source follower transistor SF is placed on the logic circuit unit wafer wf2. However, in the configuration shown in FIGS. 11 and 12, the terminals and wirings in the layers are changed according to the ease of laying out.

5. Fourth Embodiment (Image Sensor of Selective Conversion Gain Type)

Figure 15:
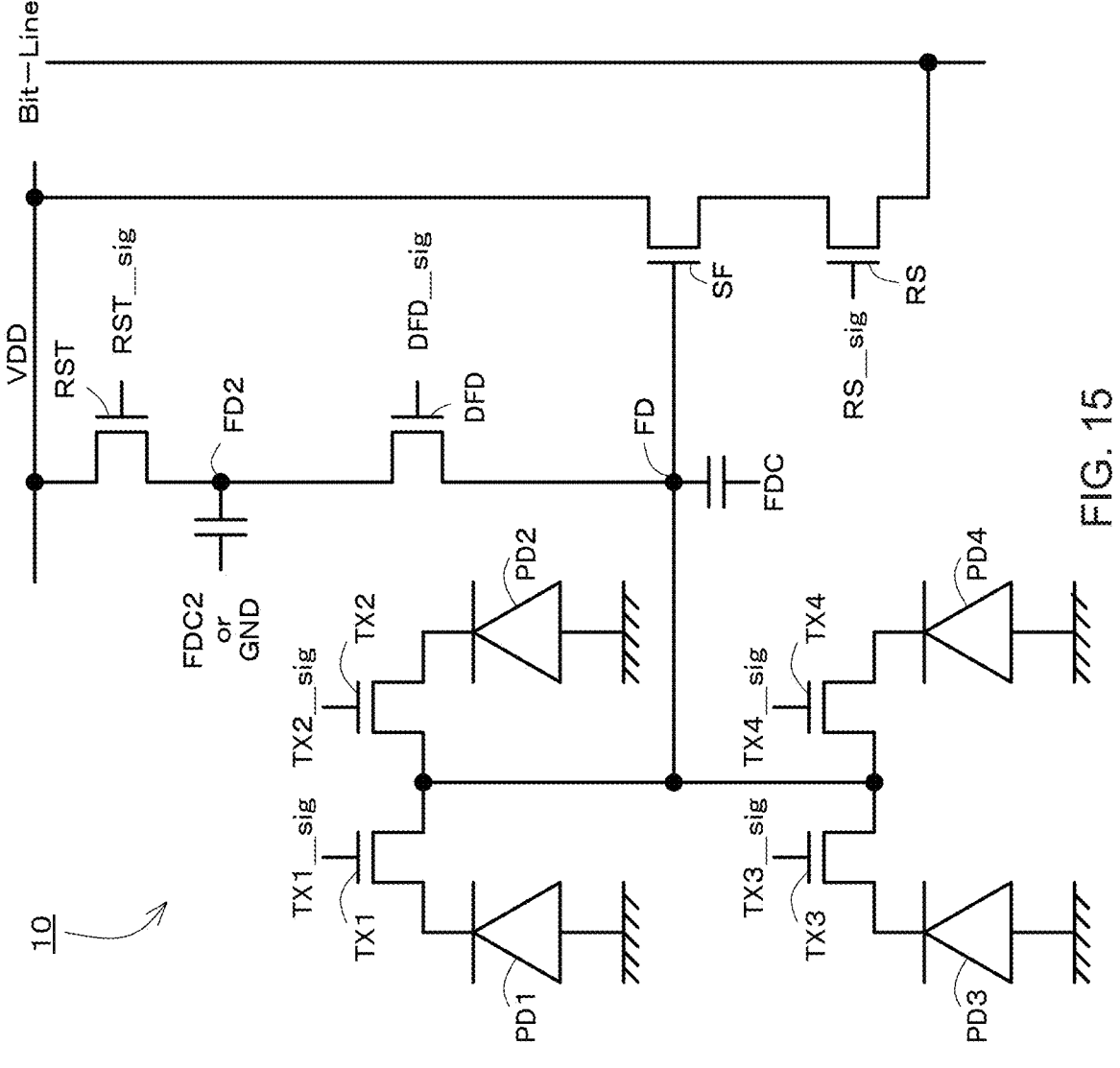
FIG. 15 is a diagram showing an example circuit structure of an image sensor according to a fourth embodiment of the present disclosure.

FIG. 15 shows an image sensor 10 according to a fourth embodiment of the present disclosure. The image sensor 10 is an image senor of a so-called dual conversion gain type (DCG) or selective conversion gain type.

In comparison to the circuit diagram of FIG. 1, in the circuit diagram of FIG. 15, an additional capacitance FD2 and a dual conversion gain transistor DFD are added to the image sensor 10. For example, the additional capacitance FD2 and the dual conversion gain transistor DFD are provided between a floating diffusion FD and a reset transistor RST. The dual conversion transistor DFD is provided between the floating diffusion FD and the additional capacitance FD2. The additional capacitance FD2 is connected to an additional capacitance control wiring FDC2 or to ground wiring GND.

The image sensor 10 shown in FIG. 15 can be switched between two types of detection efficiency of the charges, a high conversion gain (HCG) and a low conversion gain (LCG). In the high conversion gain, the dual conversion gain transistor DFD is set to the OFF state. In this case, the only destination of transfer of charges accumulated in the photodiodes PD1-PD4 is the floating diffusion FD. In the low conversion gain (LCG), the dual conversion gain transistor DFD is set at the ON state. In this case, the destinations of transfer of charges accumulated in the photodiodes PD1-PD4 include the additional capacitance FD2, in addition to the floating diffusion FD. For example, during imaging in a dark location, the imaging is performed with the setting of the high conversion gain (i.e., with the DFD being OFF), and, during imaging in a bright location, the imaging is performed with the setting of the low conversion gain (i.e., with the DFD being ON).

Figure 16:
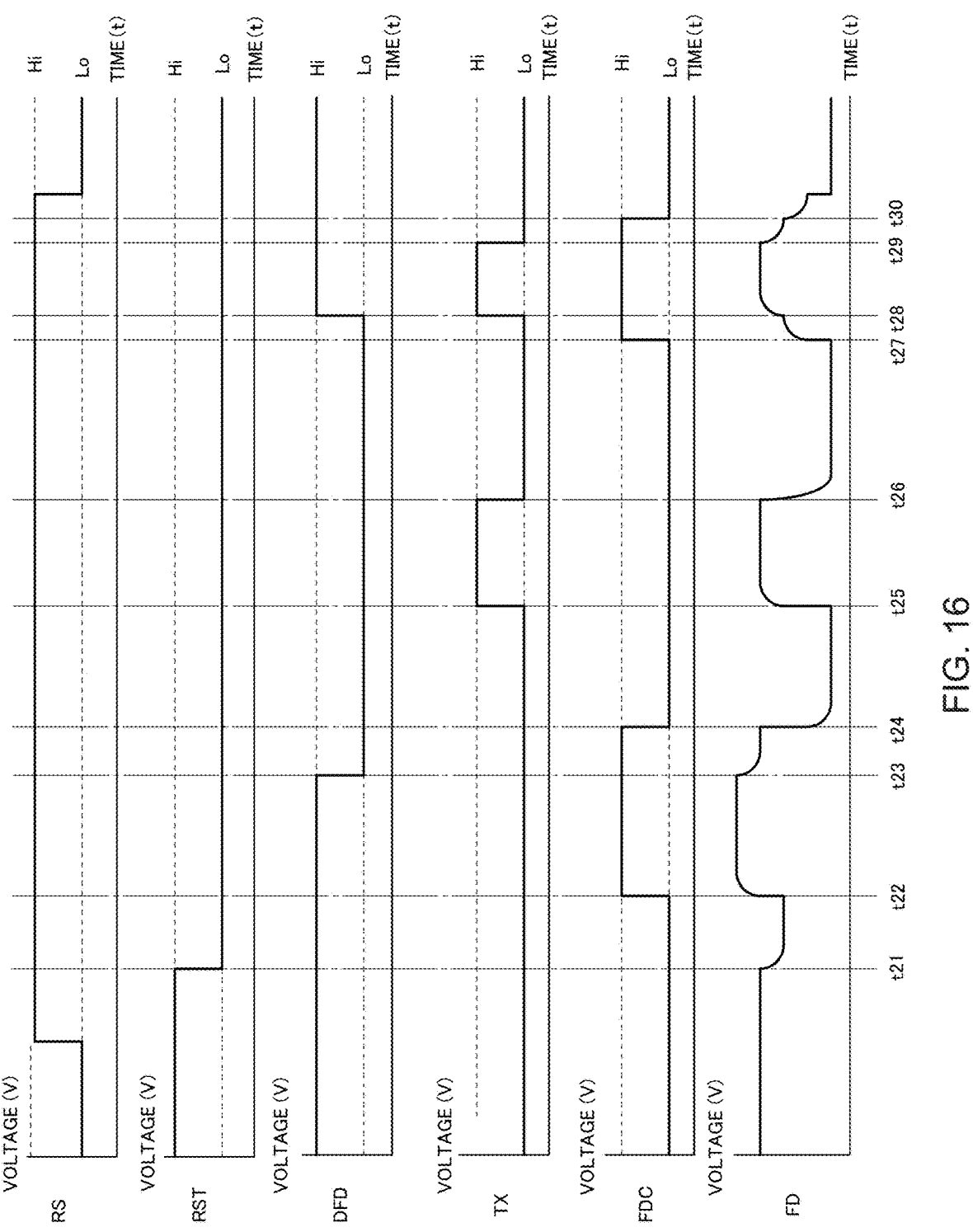
FIG. 16 is a diagram showing an example timing chart of the image sensor according to the fourth embodiment of the present disclosure.

FIG. 16 shows a timing chart of the image sensor 10 shown in FIG. 15. A period from a time t21 to a time t23 is a reset period in the low conversion gain mode. A period from the time t23 to a time t25 is a reset period in the high conversion gain mode.

A period from the time t25 to a time t26 is a charge transfer period from photodiodes PD1-PD4 to the floating diffusion FD in the high conversion gain mode. With reference to a waveform of the capacitance control wiring FDC, in the high conversion gain mode, the boost signal is not output.

A period from a time t27 to a time t30 is a charge transfer period from the photodiodes PD1-PD4 to the floating diffusion FD and the additional capacitance FD2 in the low conversion gain mode. In the timing chart of FIG. 16, a potential change in the additional capacitance FD2 is not shown. With reference to the waveform of the capacitance control wiring FDC, in the timing chart of FIG. 16, the boost signal is output in the low conversion gain mode.

With reference to the time t23 of FIG. 16, when the dual conversion gain transistor DFD is switched from the ON state to the OFF state, the potential of the floating diffusion FD is reduced (i.e., the well is shallowed) by the feedthrough. In consideration of this phenomenon, the image sensor 10 has a wiring structure as shown in FIGS. 17 and 18.

Figure 18:
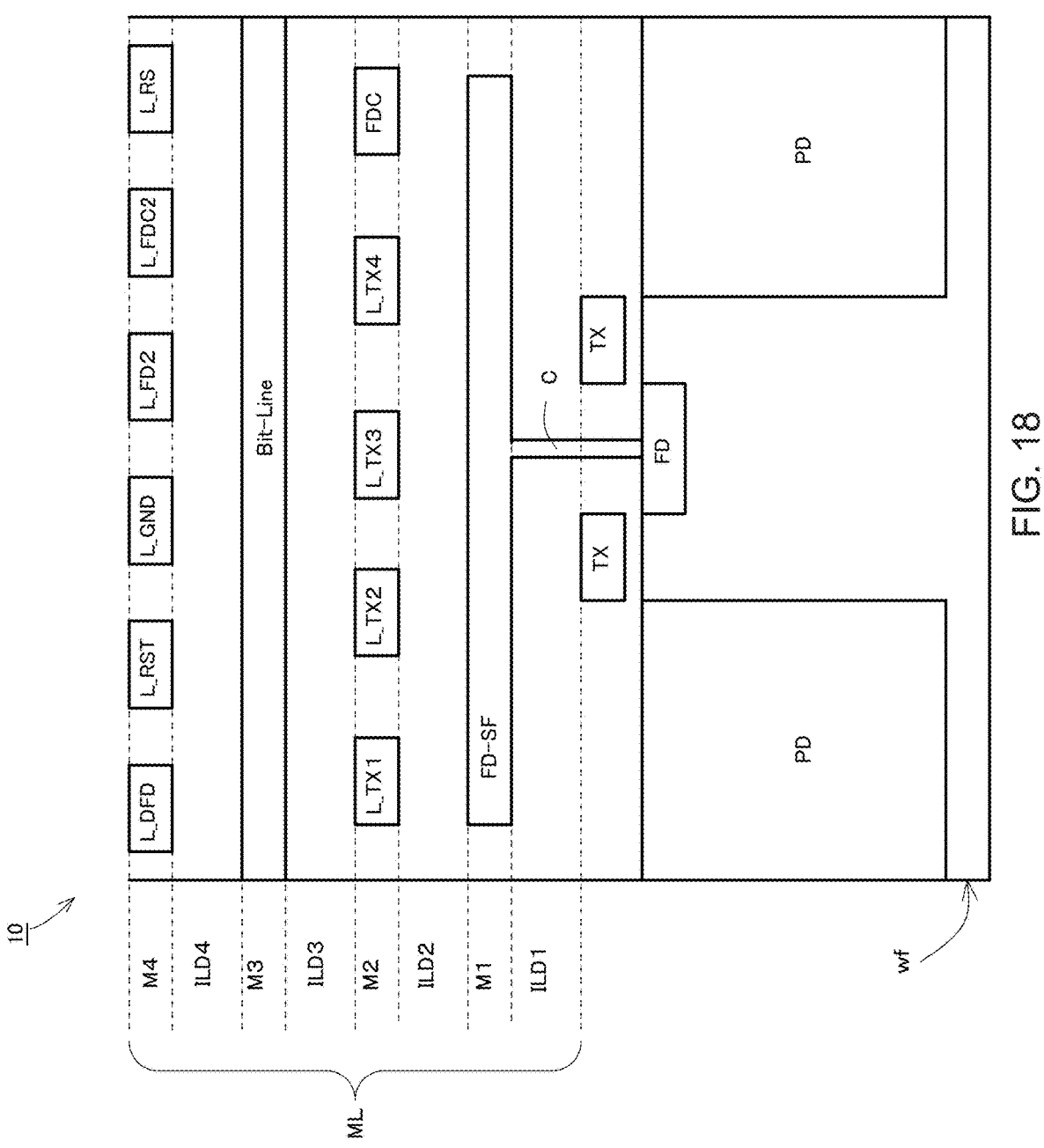
FIG. 18 is a cross-sectional view showing an example structure of the image sensor according to the fourth embodiment of the present disclosure.

That is, in addition to the wiring structure of FIGS. 7 and 8, in FIGS. 17 and 18, a dual conversion gain transistor wiring L_DFD, a ground wiring L_GND, an additional capacitance control wiring L_FDC2, and an FD2 wiring L_FD2 are placed in the multilayer wiring layer ML. Alternatively, one of the ground wiring L_GND and the additional capacitance control wiring L_FDC2 may be omitted.

The dual conversion gain transistor wiring L_DFD is connected to a gate of a dual conversion gain transistor DFD. On the dual conversion gain transistor wiring L_DFD, a dual conversion gain signal DFD_sig (voltage signal) for the dual conversion gain transistor DFD is transmitted. The ground wiring L_GND is connected to one end of the additional capacitance FD2, or, in place of the ground wiring L_GND, the additional capacitance control wiring L_FDC2 is connected to the one end of the additional capacitance FD2.

With reference to FIGS. 17 and 18, in the multilayer wiring layer ML, the dual conversion gain transistor wiring L_DFD, the ground wiring L_GND, the additional capacitance control wiring L_FDC2, and the FD2 wiring L_FD2 are formed in a second control line layer M4.

With the configuration in which the dual conversion gain transistor wiring L_DFD is formed in the second control line layer M4, the feedthrough at the time t23 in the timing chart of FIG. 16 can be suppressed. In addition, with the configuration in which the additional capacitance control wiring L_FDC2 and the FD2 wiring L_FD2 are formed in the second control line layer M4, capacitive coupling between the additional capacitance FD2 and the floating diffusion FD can be suppressed.

The present disclosure is not limited to the embodiments described above, and includes all changes and modifications without departing from the technical scope or the essence of the present disclosure defined by the claims.

The invention claimed is:

1. An image sensor comprising:

at least one wafer on which a photodiode which photoelectrically converts incident light, a floating diffusion which temporarily holds charges accumulated in the photodiode, and a source follower transistor which has a gate connected to the floating diffusion are formed; and a multilayer wiring layer laminated over the wafer, wherein wirings formed in the multilayer wiring layer includes:

a capacitance control wiring which is capacitively coupled with the floating diffusion and on which a boost signal which increases a potential of the floating diffusion is transmitted; and an FD-SF wiring which connects the floating diffusion and the source follower transistor, the multilayer wiring layer include:

an FD connection layer in which the FD-SF wiring is formed; and a first control line layer in which the capacitance control wiring is formed, and in the multilayer wiring layer, the first control line layer is a wiring layer which is closest to the FD connection layer.

2. The image sensor according to claim 1, wherein a transfer transistor which transfers charges photoelectrically converted by the photodiode to the floating diffusion is formed on the wafer, and in the first control line layer, a transfer wiring is formed on which a transfer signal for the transfer transistor is transmitted.

3. The image sensor according to claim 2, wherein a reset transistor which resets the potential of the floating diffusion to a reference potential is formed, the wirings formed in the multilayer wiring layer further include a reset wiring on which a reset signal for the reset transistor is transmitted, and the multilayer wiring layer further includes a second control line layer in which the reset wiring is formed.

4. The image sensor according to claim 3, wherein a row selection transistor which is connected to a source of the source follower transistor is formed, and in the second control line layer, a row selection wiring is formed on which a row selection signal for the row selection transistor is transmitted.

5. The image sensor according to claim 4, wherein the FD-SF wiring intersects the transfer wiring and the capacitance control wiring in a circuit plan view.

6. The image sensor according to claim 5, wherein the FD connection layer is formed in a first layer of the multilayer wiring layer, and the first control line layer is formed in a second layer of the multilayer wiring layer.

7. The image sensor according to claim 6, wherein in the multilayer wiring layer, the second control line layer is formed in a manner to be separated from the FD connection layer by three or more layers.

8. The image sensor according to claim 7, wherein the multilayer wiring layer further includes a constant voltage wiring layer in which a constant voltage wiring, including a reference potential wiring on which the reference potential is applied, is formed, and the constant voltage wiring layer is formed between the first control line layer and the second control line layer.

9. The image sensor according to claim 3, wherein the at least one wafer includes a pixel unit wafer, and a logic circuit unit wafer, the photodiode, the floating diffusion, and the transfer transistor are formed on the pixel unit wafer, the reset transistor, the row selection transistor, and the source follower transistor are formed on the logic circuit unit wafer, the FD connection layer is formed in a first layer of the multilayer wiring layer of the pixel unit wafer, the first control line layer is formed in a second layer of the multilayer wiring layer of the pixel unit wafer, the second control line layer is formed in the multilayer wiring layer of the logic circuit unit wafer, and the multilayer wiring layer of the logic circuit unit wafer is laminated in an opposing manner over the multilayer wiring layer of the pixel unit wafer.

10. The image sensor according to claim 9, wherein the multilayer wiring layer further includes a constant voltage wiring layer in which a constant voltage wiring, including a reference potential wiring on which the reference potential is applied, is formed, the second control line layer is formed in a first layer of the multilayer wiring layer of the logic circuit unit wafer, the constant voltage wiring layer is formed in a second layer of the multilayer wiring layer of the logic circuit unit wafer, and the constant voltage wiring layer on the logic circuit unit wafer is laminated over the first control line layer on the pixel unit wafer.

11. The image sensor according to claim 3, wherein the at least one wafer includes a pixel unit wafer and a logic circuit unit wafer, the photodiode, the floating diffusion, the source follower transistor, and the transfer transistor are formed on the pixel unit wafer, the reset transistor and the row selection transistor are formed on the logic circuit unit wafer, the FD connection layer is formed in a first layer of the multilayer wiring layer of the pixel unit wafer, the first control line layer is formed in a second layer of the multilayer wiring layer of the pixel unit wafer, the second control line layer is formed in the multilayer wiring layer of the logic circuit unit wafer, and the multilayer wiring layer of the logic circuit unit wafer is laminated in an opposing manner over the multilayer wiring layer of the pixel unit wafer.

12. The image sensor according to claim 3, wherein
an additional capacitance and a selective conversion gain transistor provided between the additional capacitance and the floating diffusion are formed on the wafer,
the wirings formed in the multilayer wiring layer further include a selective conversion gain transistor wiring on which a connection signal for the selective conversion gain transistor is transmitted, and
the selective conversion gain transistor wiring is formed in the second control line layer.

13. An image sensor comprising:
at least one wafer on which a photodiode which photo-electrically converts incident light, a transfer transistor which transfers charges photoelectrically converted by the photodiode, a floating diffusion which temporarily holds charges transferred from the transfer transistor, a reset transistor which resets a potential of the floating diffusion to a reference potential, and a source follower transistor which has a gate connected for the floating diffusion are formed; and
a multilayer wiring layer laminated over the wafer, wherein
wirings formed in the multilayer wiring layer include:
a transfer wiring on which a transfer signal for the transfer transistor is transmitted;
a capacitance control wiring which is capacitively coupled with the floating diffusion and on which a boost signal which increases the potential of the float-ing diffusion is transmitted;
a reset wiring on which a reset signal for the reset transistor is transmitted; and
an FD-SF wiring which connects the floating diffusion and the source follower transistor,
in the multilayer wiring layer, the transfer wiring, the capacitance control wiring, and the reset wiring are formed in a single layer, and
the transfer wiring and the capacitance control wiring have wider wiring widths than the reset wiring.

14. The image sensor according to claim 13, wherein
a row selection transistor which is connected to a source of the source follower transistor is formed on the wafer,
the wirings formed in the multilayer wiring layer further include a row selection wiring on which a row selection signal for the row selection transistor is transmitted,
in the multilayer wiring layer, in addition to the transfer wiring, the capacitance control wiring, and the reset wiring, the row selection wiring is formed in the single layer, and
the row selection wiring has a narrower wiring width than the transfer wiring and the capacitance control wiring.

15. A method of manufacturing an image sensor, com-prising:
forming, on at least one wafer, a photodiode which photoelectrically converts incident light, a floating dif-fusion which temporarily holds charges accumulated in the photodiode, and a source follower transistor which has a gate connected to the floating diffusion;
laminating a multilayer wiring layer over the wafer, wherein wirings included in the multilayer wiring layer include a capacitance control wiring which is capaci-tively coupled with the floating diffusion, and on which a boost signal which increases a potential of the floating diffusion is transmitted, and an FD-SF wiring which connects the floating diffusion and the source follower transistor;
forming, as the multilayer wiring layer, an FD connection layer in which the FD-SF wiring is formed, and a first control line layer in which the capacitance control wiring is formed; and
placing the first control line layer closest to the FD connection layer among the wiring layers of the mul-tilayer wiring layer.

16. The method of manufacturing the image sensor according to claim 15, further comprising:
forming, on the wafer, a transfer transistor which transfers charges photoelectrically converted by the photodiode to the floating diffusion; and
forming, in the first control line layer, a transfer wiring on which a transfer signal for the transfer transistor is transmitted.

17. The method of manufacturing the image sensor according to claim 16, further comprising:
forming a reset transistor which resets the potential of the floating diffusion to a reference potential, wherein the wirings formed in the multilayer wiring layer further include a reset wiring on which a reset signal for the reset transistor is transmitted; and
forming, as the multilayer wiring layer, a second control line layer in which the reset wiring is formed.

18. The method of manufacturing the image sensor according to claim 17, further comprising:
forming a row selection transistor which is connected to a source of the source follower transistor; and
forming a row selection wiring, on which a row selection signal for the row selection transistor is transmitted, in the second control line layer.

19. The method of manufacturing the image sensor according to claim 17, wherein
the at least one wafer includes a pixel unit wafer and a logic circuit unit wafer, and
the method further comprises:
forming the photodiode, the floating diffusion, and the transfer transistor on the pixel unit wafer;
forming the reset transistor and the source follower tran-sistor on the logic circuit unit wafer;
forming the FD connection layer in a first layer of the multilayer wiring layer of the pixel unit wafer;
forming the first control line layer in a second layer of the multilayer wiring layer of the pixel unit wafer;
forming the second control line layer in the multilayer wiring layer of the logic circuit unit wafer; and
laminating the multilayer wiring layer of the logic circuit unit wafer in an opposing manner over the multilayer wiring layer of the pixel unit wafer.

20. A method of manufacturing an image sensor, com-prising:
forming, on at least one wafer, a photodiode which photoelectrically converts incident light, a transfer tran-sistor which transfers charges photoelectrically con-verted by the photodiode, a floating diffusion which temporarily holds charges transferred from the transfer transistor, a reset transistor which resets a potential of the floating diffusion to a reference potential, and a source follower transistor which has a gate connected to the floating diffusion;
laminating a multilayer wiring layer over the wafer, wherein wirings formed in the multilayer wiring layer include a transfer wiring on which a transfer signal for the transfer transistor is transmitted, a capacitance control wiring which is capacitively coupled with the floating diffusion and on which a boost signal which increases the potential of the floating diffusion is transmitted, a reset wiring on which a reset signal for the reset transistor is transmitted, and an FD-SF wiring which connects the floating diffusion and the source follower transistor;

forming the transfer wiring, the capacitance control wiring, and the reset wiring in a single layer in the multilayer wiring layer; and forming the transfer wiring and the capacitance control wiring with wider wiring widths than the reset wiring.

\* \* \* \* \*